United States Patent [19]

Watanabe et al.

[11] Patent Number: 5,309,001
[45] Date of Patent: May 3, 1994

[54] LIGHT-EMITTING DIODE HAVING A SURFACE ELECTRODE OF A TREE-LIKE FORM

[75] Inventors: Masanori Watanabe, Nara; Mitsuhiro Matsumoto, Tenri; Hiroshi Nakatsu, Tenri; Tadashi Takeoka, Tenri; Osamu Yamamoto, Nara; Kazuaki Sasaki, Yao, all of Japan

[73] Assignee: Sharp Kabushiki Kaisha, Osaka, Japan

[21] Appl. No.: 980,666

[22] Filed: Nov. 24, 1992

[30] Foreign Application Priority Data

Nov. 25, 1991 [JP] Japan ................... 3-309071
Jun. 17, 1992 [JP] Japan ................... 4-157878
Jun. 18, 1992 [JP] Japan ................... 4-159242

[51] Int. Cl.⁵ .......................................... H01L 33/00
[52] U.S. Cl. ............................ 257/99; 257/91; 257/773
[58] Field of Search ............... 257/13, 91, 94, 96, 257/773, 99

[56] References Cited

U.S. PATENT DOCUMENTS

| | | | |
|---|---|---|---|
| 4,864,370 | 9/1989 | Gaw et al. | 257/94 |
| 5,132,750 | 7/1992 | Kato et al. | 257/96 |

FOREIGN PATENT DOCUMENTS

| | | | |
|---|---|---|---|
| 0045678 | 2/1982 | European Pat. Off. | 257/99 |
| 56-142666 | 11/1981 | Japan | 257/99 |
| 57-40986 | 3/1982 | Japan | 257/99 |
| 57-97686 | 6/1982 | Japan | 257/99 |
| 57-183081 | 11/1982 | Japan | 257/99 |
| 61-5585 | 1/1986 | Japan | 257/99 |
| 61-6880 | 1/1986 | Japan | 257/99 |
| 61-296779 | 12/1986 | Japan | 257/99 |
| 63-245969 | 10/1988 | Japan | 257/99 |
| 2-174273 | 7/1990 | Japan | 257/99 |

OTHER PUBLICATIONS

*Patent Abstracts of Japan*, vol. 10, No. 145 (E-407)(2202) 28 May 1986 & JP-A-61-6 880 (Roomu K.K.) 13 Jan. 1986, Ichihara et al.
*Patent Abstracts of Japan*, vol. 13, No. 53 (E713) 7 Feb. 1989 & JP-A-63-245 969 (Seiko Epson Corp.), 13 Oct. 1988, Takashi.
Stinson, et al., "High-efficiency InGaP light-emitting diodes on GaP substrates", *Applied Physics Letters*, 58(18):2012–2014 (1991).

Primary Examiner—Rolf Hille
Assistant Examiner—Minhloan Tran
Attorney, Agent, or Firm—Morrison & Foerster

[57] ABSTRACT

A surface electrode on a surface of a LED has a pad, and further, at least first-order branches linearly extending from the pad, second-order branches diverged and linearly extending from the first-order branches, and third-order branches diverged and linearly extending from the second-order branches. The pad out of the surface electrode is not in electrical contact with a underlying semiconductor layer, whereas the surface electrode and the semiconductor layer are in electrical contact with each other at ends of the highest-order branches. Also, the semiconductor layer is provided along a pattern of the surface electrode in a mesa shape. Thus, ineffective light emission underneath the surface electrode is relatively reduced so that external quantum efficiency can be improved, and moreover even shorter-wavelength light can be allowed to go out at high efficiency by omitting a current diffusion layer.

16 Claims, 16 Drawing Sheets

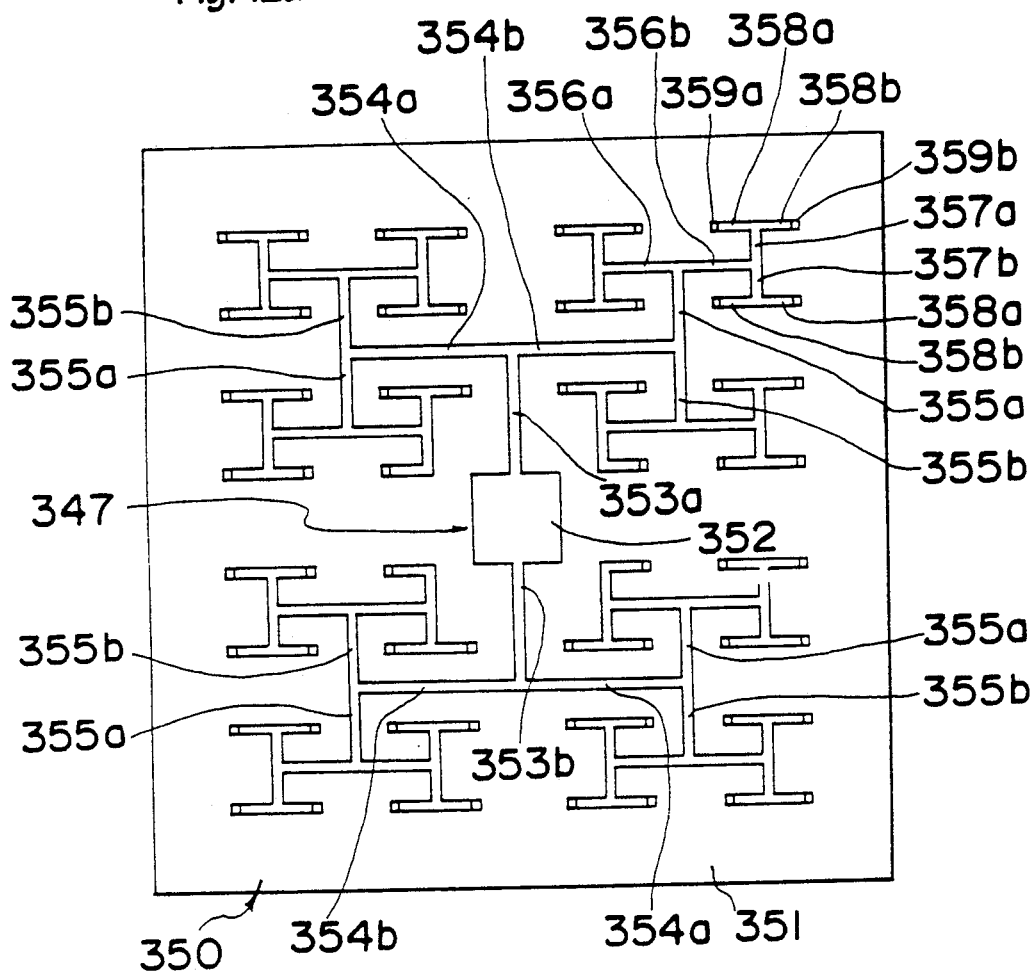
Fig. 12a
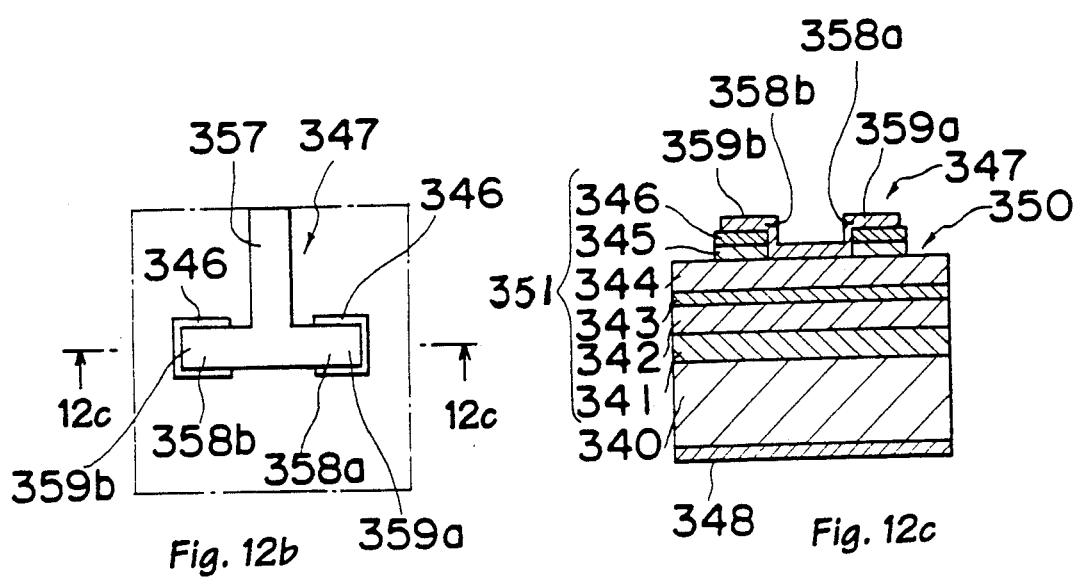
Fig. 12b
Fig. 12c

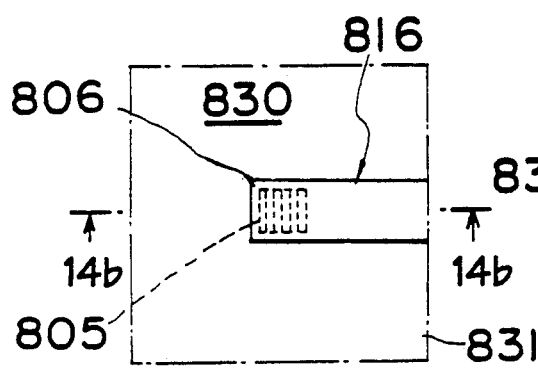
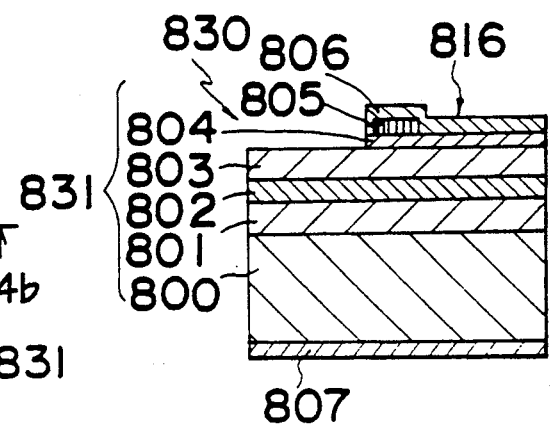
Fig. 14a
Fig. 14b
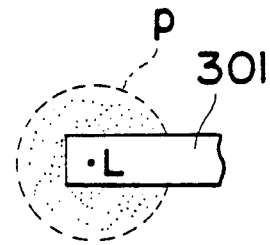
Fig. 15a
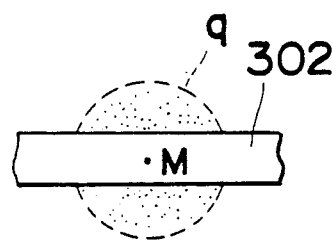
Fig. 15b
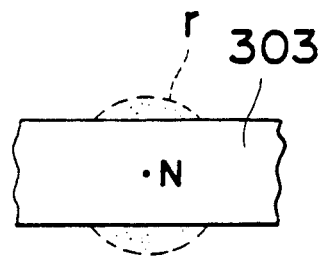
Fig. 15c

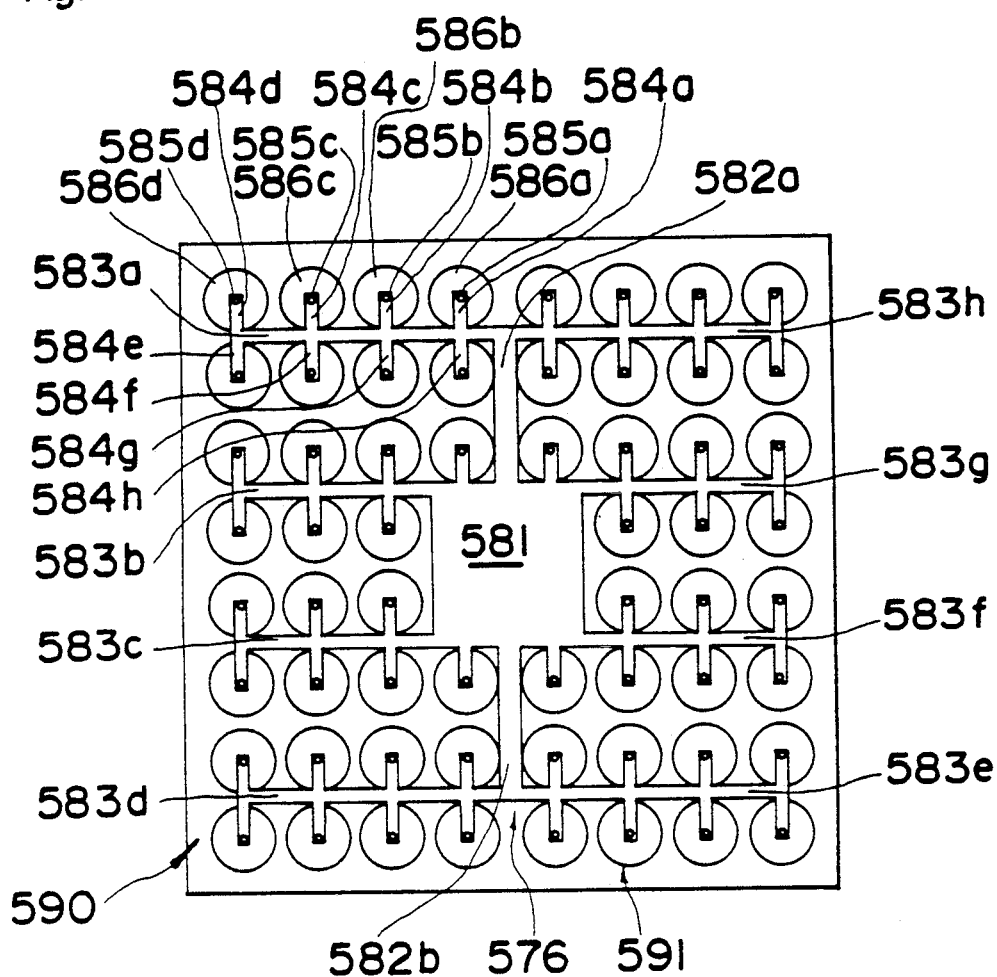
Fig. 19a
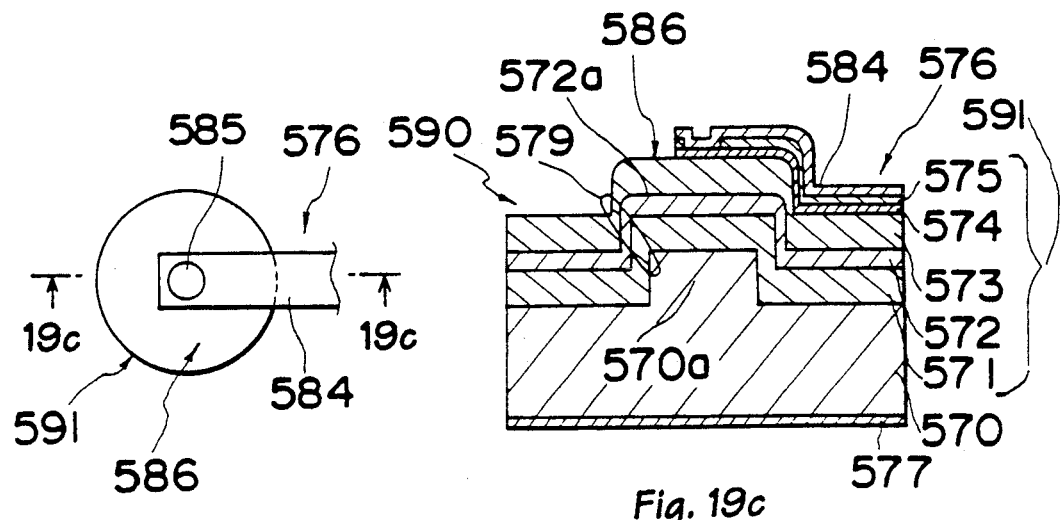
Fig. 19b
Fig. 19c

LIGHT-EMITTING DIODE HAVING A SURFACE ELECTRODE OF A TREE-LIKE FORM

BACKGROUND OF THE INVENTION

1. Field of the Invention

The present invention relates to a light-emitting diode (LED) for use of display or the like.

2. Description of the Prior Art

In recent years, there have been developed light-emitting diodes (LEDs) that emit yellow or green light using aluminium gallium indium phosphide (AlGaInP) series materials, besides those using gallium arsenide phosphide (GaAsP) series or gallium phosphide (GaP) series materials.

A prior-art AlGaInP series LED is fabricated in the following way. First, as shown in FIG. 1 which is a sectional view of the LED, on a surface of an n-type GaAs substrate 90 are stacked over all an n-type AlGaInP clad layer 91, an undoped AlGaInP light-emitting layer 92, a p-type AlGaInP clad layer 93, a p-type AlGaAs current diffusion layer 94, a p-type GaAs contact layer 95, and a p-side surface electrode 96. Next, as shown in FIG. 2 which is a plan view showing the LED, this surface electrode 96 and the p-type GaAs layer 95 are patterned by removing part of them. As a result, the surface electrode 96 is composed of a circular pad 98 for performing wire-bonding, and branches 99a, 99b, 99c, and 99d linearly extending from the pad 98 in four directions. By providing a plurality of branches 99a, 99b, 99c, and 99d in this way, it is arranged that electrical current is diffused within a LED chip as uniformly as possible. Thereafter, an n-side rear-face electrode 97 is formed on the rear face of the substrate 90. Light emitted from the light-emitting layer 92, being absorbed into the substrate 90 and the surface electrode 96, goes out of the chip through a region 100a of a chip surface 100 resulting from partially removing the surface electrode 96 and through a side face 101.

It should be noted that this LED is of double-hetero structure in which the light-emitting layer 92 is sandwiched by the two clad layers 91 and 93 greater in bandgap than the light-emitting layer 92. With this structure, to attain an effective confinement of electrons and holes into the light-emitting layer 92 by the clad layers 91 and 93, the Al composition ratio y is required to be increased to as much as 0.7 to 1 in the composition $(Al_yGa_{1-y})_{0.5}In_{0.5}P$ of the clad layers 91 and 93. However, if the Al composition ratio y is increased to such a value, doping a p-type or n-type element into the clad layers 91 and 93 becomes difficult so that the specific resistance of the clad layers 91 and 93 becomes difficult to lower. Therefore, in this LED, the current diffusion layer 94 is provided to prevent the current from concentrating underneath the surface electrode 96, thereby increasing the amount of light emitted in the region 100a that is not covered with the surface electrode 96.

However, the current diffusion layer 94 does not work to a sufficient extent, so that ineffective light emission underneath the surface electrode 96 is greater in amount relative to light emission in the region 100a that is not covered with the surface electrode 96. This accounts for the fact that the prior-art LED is worse in external quantum efficiency, as one problem.

Another problem is that since the wavelength of light emission is in the range of 590 nm (yellow) to 550 nm (green), there will occur light absorption in the AlGaAs current diffusion layer 94. This is attributed to the fact that even if $Al_xGa_{1-x}As$ was set to a composition ratio of x=1 that gives the widest bandgap, its absorption end would be 574 nm, not allowing the light of shorter wavelengths to pass through the layer. In addition, AlAs (corresponding to x=1) is susceptible to corrosion in air, unsuitable for use as the surface layer.

Another example of the prior-art AlGaInP series LEDs is such as shown in FIGS. 3 and 4. FIG. 3 shows the surface of the LED and FIG. 4 is a sectional view taken along the line IV—IV as indicated by arrows in FIG. 3. This LED is fabricated in the following way. First, as shown in FIG. 4, on a surface 180 of an n-type GaAs substrate 190 are stacked over all an n-type AlGaInP clad layer 191, an undoped AlGaInP light-emitting layer 192, a p-type AlGaInP clad layer 193, a p-type GaAs contact layer 194, and a surface electrode (e.g. AuZn) 195. Next, the stacked surface electrode 195 and the layers 194, 193, 192, and 191 are selectively removed until a substrate surface 190a is reached, leaving specified portions to provide mesa (trapezoidal) portions 200. The pattern of the mesa portions 200 (approximately identical to the pattern of the surface electrode 195) is, as shown in FIG. 3, provided in combination of a pad 198 for performing wire-bonding, lateral branches 199a and 199b extending from the pad 198, and longitudinal branches 200a, . . . , 200h crossing the lateral branches 199a and 199b. Thereafter, as shown in FIG. 4, a rear-face electrode 196 is formed on the rear face of the substrate 190.

Referring to the longitudinal branch 200h in FIG. 4 by way of example, light emitted from the light-emitting layer 192 goes out of the LED primarily through right and left side faces 201a and 201b of a mesa portion 200. This is attributed to the fact that the light beams traveling upward and downward will be absorbed into the surface electrode 195 and the substrate 190. As will be understood from this, the reason the mesa portions 200 are formed on the substrate surface 180 is to take light out of the LED efficiently by increasing the area of a light outgoing face (mesa slant face).

However, the construction of the mesa portions 200 is no more than such an arrangement that the lateral branches 199a and 199b and the longitudinal branches 200a, . . . , 200h merely cross each other, involving relatively long longitudinal lengths of the branches. On this account, most of the light emitted in the longitudinal direction (back and forth in FIG. 4) within each of the branches 200a, . . . , 200h will not reach the ends (e.g. an end 201c) of the branches, resulting in ineffective light emission. As a result, the above prior-art LED is not so good in external quantum efficiency, disadvantageously.

SUMMARY OF THE INVENTION

The present invention has been developed with a view to substantially solving the above described disadvantages and has for its essential object to provide a light-emitting diode which is capable of improving the external quantum efficiency thereof by relatively reducing ineffective light emission underneath a surface electrode and of emitting shorter-wavelength light efficiently by omitting a current diffusion layer.

In order to achieve the aforementioned object, there is provided a light-emitting diode which has a semiconductor layer including a light-emitting layer, and a surface electrode successively stacked on a surface of a semiconductor substrate and which further has a rear-face electrode on a rear face of the substrate, light emitted from the light-emitting layer being made to go out through a portion of the semiconductor layer that is not covered with the surface electrode, the surface electrode comprising at least:

a pad; first-order branches linearly extending from the pad; second-order branches diverged and linearly extending from the first-order branches; and third-order branches diverged and linearly extending from the second-order branches.

It is preferable that a line width of the branches of each order decreases as the number of order increases.

It is also preferable that a length of the branches of each order decreases at a constant rate as the number of order increases.

It is also preferable that an angle formed by the branches having two successive numbers of order is 0° or 90°.

Any great current diffusion resistance could be compensated only by arranging the surface electrode to be not so far from any portion of the light-emitting layer. However, merely increasing the area of the surface electrode would rather suppress the light from going out of the LED. Conversely, narrowing the width of the surface electrode to avoid such a case would result in an increased wiring resistance at the surface electrode. Such contradictory requirements can be met by the present invention to a maximum.

With the above-described arrangement, since the surface electrode provided on the surface of the semiconductor layer has the first-order branches extending from the pad, the second-order branches extending from the first-order branches, and the third-order branches extending from the second-order branches (even higher-order branches may be provided), the surface of the semiconductor layer is covered with the branches of various orders in a tree-like form. This arrangement allows the current to be diffused throughout the semiconductor layer, with the current diffusion resistance substantially reduced. Accordingly, light emission in the region that is not covered with the surface electrode is greater in amount relative to ineffective light emission underneath the surface electrode. Consequently, the light easily goes out of the LED, which leads to an improved external quantum efficiency. Furthermore, by virtue of the shape of the surface electrode that allows the current to be sufficiently diffused within the semiconductor layer, it is no longer necessary to provide an AlGaAs current diffusion layer, for example, in an AlGaInP series LED of shorter wavelengths than that of yellow. Accordingly, the resulting layer characteristic is preferable without involving light absorption even with shorter-wavelength light. In addition, this shape of the surface electrode can be applied to commonly-used AlGaAs-, GaP-, ZnSe-, GaN-, and SiC-series LEDs as well as to AlGaInP-series LEDs. This contributes to improvement in the characteristics of various types of LEDs.

Further, when the line width of the branches of each order decreases as the number of order increases, the current diffusion resistance decreases effectively without causing the area of the part underneath the surface electrode out of the semiconductor layer to increase to a considerable extent. Accordingly, the external quantum efficiency is further improved. Yet since the line width of lower-order branches is relatively wide, the wiring resistance little increases. Also, when the line width of the branches of each order decreases at a constant rate as the number of order increases, the surface electrode becomes easy to pattern-design.

When the length of the branches of each order decreases at a constant rate as the number of order increases, the surface of the semiconductor layer is efficiently covered with the branches of various orders. In other words, the approximately entire region of the semiconductor layer surface is covered in a tree-like form with almost no higher-order branches overlapping with one another. Moreover, since the length of the branches of each order decreases at a constant rate as the number of order increases, the surface electrode becomes easy to pattern-design.

Similarly, when the angle between branches having two successive numbers of orders is 0° or 90°, the semiconductor layer surface is efficiently covered with the branches of various orders. In other words, the approximately entire region of the semiconductor layer surface is covered in a tree-like form without higher-order branches overlapping with one another. Yet the surface electrode becomes easy to pattern-design.

Further, there is provided a light-emitting diode which has a semiconductor layer including a light-emitting layer, and a surface electrode successively stacked on a surface of a semiconductor substrate and which further has a rear-face electrode on a rear face of the substrate, light emitted from the light-emitting layer being made to go out through a portion of the semiconductor layer that is not covered with the surface electrode, the surface electrode comprising at least:

a pad; first-order branches linearly extending from the pad; second-order branches diverged and linearly extending from the first-order branches; and third-order branches diverged and linearly extending from the second-order branches, wherein ends of the highest-order branches of the surface electrode and the semiconductor layer are in electrical contact with each other while the pad of the surface electrode and the semiconductor layer are electrically isolated from each other.

It is also preferable that the semiconductor layer has, on a surface electrode side, a contact layer made of a material that makes ohmic contact with the surface electrode and that an insulating layer is provided between portions of the surface electrode other than the ends of the surface electrode and the semiconductor layer.

It is also preferable that the semiconductor layer has, on the surface electrode side, a layer made of a material that yields a Schottky barrier with respect to the surface electrode and moreover has, between the layer and the ends of the highest-order branches of the surface electrode, a contact layer made of a material that makes ohmic contact with the surface electrode.

It is also preferable that the semiconductor layer has, on the surface electrode side, a contact layer made of a material that makes ohmic contact with the surface electrode and having a conductive type of p-type or n-type, and moreover has, between the contact layer and the portions of the surface electrode other than the ends of the surface electrode, a current blocking layer having a conductive type different from that of the contact layer.

It is also preferable that the surface electrode comprises an upper electrode provided on the entire region occupied by the surface electrode and made of a material that does not make ohmic contact with a surface of the semiconductor layer, and a lower electrode provided between the upper electrode and the surface of the semiconductor layer at the ends of the highest-order branches and made of a material that makes ohmic contact with the semiconductor layer surface.

It is also preferable that the line width of the branches of each order decreases as the number of order increases.

With the above arrangement, since the surface electrode provided on the semiconductor layer surface has the first-order branches extending from the pad, the second-order branches extending from the first-order branches, and the third-order branches extending from the second-order branches (even higher-order branches may be provided), the semiconductor layer surface is covered with the branches of various orders in a tree-like form. Moreover, since the pad of the surface electrode does not make contact with the semiconductor layer thereunderneath and since the surface electrode and the semiconductor layer make contact with each other at the ends of the highest-order branches, the current is diffused throughout the semiconductor layer, with the current diffusion resistance substantially decreased. As a result of this, light emission in the region that is not covered with the surface electrode is greater in amount relative to ineffective light emission underneath the surface electrode. For example, as shown in FIGS. 15 (b) and (c) that are views for explaining the function of the invention, light beams q, r emitted at intermediate points (just below points M, N) of branches of surface electrodes 302, 303 are mostly interrupted by the electrodes, whereas, as shown in FIG. 15 (a), a light beam p emitted at an end of a branch of a surface electrode 301 is less interrupted by the electrode. Accordingly, the light easily goes out of the LED, which leads to improved external quantum efficiency. Furthermore, by virtue of the shape of the surface electrode that allows the current to be sufficiently diffused within the semiconductor layer, it is no longer necessary to provide an AlGaAs current diffusion layer, for example, in an AlGaInP series LED of shorter wavelengths than yellow. Accordingly, the resulting layer characteristic is preferable without involving light absorption even with shorter-wavelength light. In addition, the shape of the surface electrode can be applied to commonly-used AlGaAs-, GaP-, ZnSe-, GaN-, and SiC-series LEDs as well as to AlGaInP-series LEDs. It is effective particularly to ZnCdSe-series LEDs that can hardly obtain a low-resistance current diffusion layer.

Also, when the semiconductor layer has, on the surface electrode side, a contact layer made of a material that makes ohmic contact with the surface electrode and further has, between portions of the surface electrode other than the ends and the semiconductor layer, an insulating layer, the ends of the highest-order branches of the surface electrode and the semiconductor layer make successful electrical contact with each other through the contact layer, whereas the portions of the surface electrode other than the ends and the semiconductor layer are electrically isolated from each other by the insulating layer. Accordingly the current is injected only at the end portions of the surface electrode. As a result of this, as described above, the light easily goes out of the LED, which leads to further improved external quantum efficiency.

When the semiconductor layer has, on the surface electrode side, a layer made of a material that yields a Schottky barrier to the surface electrode and moreover has, between the aforementioned layer and the ends of the highest-order branches of the surface electrode, a contact layer made of a material that makes ohmic contact with the surface electrode, the ends of the highest-order branches of the surface electrode and the semiconductor layer make successful electrical contact with each other through the contact layer, whereas the portions of the surface electrode other than the ends and the semiconductor layer are brought by the Schottky barrier into a state in which the current is suppressed from flowing (i.e. a state in which the current will not flow unless a certain high level of voltage is applied). Accordingly, in practice, the current is injected only at the end portions of the surface electrode. As a result, as described above, the light easily goes out of the LED, which leads to further improved external quantum efficiency.

When the semiconductor layer has, on the surface electrode side, a contact layer made of a material that makes ohmic contact with the surface electrode and having the conductive type of p-type or n-type, and further has the current blocking layer having a conductive type different from the aforementioned contact layer between the contact layer and the portions of the surface electrode other than the ends, the ends of the highest-order branches of the surface electrode and the semiconductor layer make successful electrical contact with each other through the contact layer, whereas the portions of the surface electrode other than the ends and the semiconductor layer are brought into an electrically non-conducting state by the current blocking layer. Accordingly, the current is injected only at the end portions of the surface electrode. As a result, as described above, the light easily goes out of the LED, which leads to further improved external quantum efficiency.

When the surface electrode is composed of the upper electrode provided on the overall region occupied by the surface electrode and made of a material that makes no ohmic contact with the semiconductor layer surface, and a lower electrode provided between the upper electrode and the semiconductor layer surface at the ends of the highest-order branches and made of a material that makes ohmic contact with the semiconductor layer surface, the ends of the highest-order branches of the surface electrode and the semiconductor layer make successful electrical contact with each other through the lower electrode, whereas the portions of the surface electrode other than the ends and the semiconductor layer are brought into an electrically non-conducting state. Accordingly, the current is injected only at the end portions of the surface electrode. As a result, as described above, the light easily goes out of the LED, which leads to further improved external quantum efficiency.

When the line width of the branches of each order decreases as the number of order increases, the line width of lower-order branches is relatively wide, so that the wiring resistance little increases. Also, when the line width of the branches of each order decreases at a constant rate as the number of order increases, the surface electrode becomes easy to pattern-design.

Furthermore, there is provided a light-emitting diode which has a semiconductor layer including a light-emitting layer, and a surface electrode successively stacked on a surface of a semiconductor substrate and which further has a rear-face electrode on a rear face of the substrate, light emitted from the light-emitting layer being made to go out through a portion of the semiconductor layer that is not covered with the surface electrode, the surface electrode comprising at least:

a pad; first-order branches linearly extending from the pad; second-order branches diverged and linearly extending from the first-order branches; and third-order branches diverged and linearly extending from the second-order branches, wherein at least part of the semiconductor layer is provided along a pattern of the surface electrode in a protruding mesa shape.

Further, there is provided a light-emitting diode which has a semiconductor layer including a light-emitting layer, and a surface electrode successively stacked on a surface of a semiconductor substrate and which further has a rear-face electrode on a rear face of the substrate, light emitted from the light-emitting layer being made to go out through a portion of the semiconductor layer that is not covered with the surface electrode, the surface electrode comprising at least:

a pad; first-order branches linearly extending from the pad; second-order branches diverged and linearly extending from the first-order branches; and third-order branches diverged and linearly extending from the second-order branches, wherein protrusions are formed by at least part of the semiconductor layer and provided under each end of the highest-order branches of the surface electrode.

It is also preferable that the ends of the highest-order branches of the surface electrode and the semiconductor layer are in electrical contact with each other while the rest of the surface electrode and the semiconductor layer are not in electrical contact with each other.

The present invention has been developed from the following considerations made by the present inventors. Referring to FIGS. 20(a), (b), (c), (d), (e) and (f), which are views for explaining the function of the invention, the principle of the present invention is described below.

FIGS. 20 (a) and (b) are schematic illustrations of a light-emitting diode having a flat semiconductor layer surface 1, as viewed from the top and a side thereof (for simplicity, a surface electrode is omitted in illustration). Of the light emitted from a light emission point L, a light beam p approximately perpendicularly incident on the surface 501 goes out of the LED (actually, interrupted by the surface electrode). However, a light beam q obliquely incident on the surface 501 is fully reflected and therefore does not go out of the LED, resulting in ineffective light emission. Next, FIGS. 20 (c) and (d) illustrate a light-emitting diode having on its surface a stripe- and mesa-shaped branch 502, as in the prior-art LED shown in FIGS. 3 and 4. In this case, of the light emitted from a light emission point M, not only a light beam r going upward but also light beams s, t going sidewise go out of the LED. However, as described before, light beams u, v that are steered longitudinally of the branch 502 do not go out of the LED, resulting in ineffective light emission. In contrast to this, as shown in FIGS. 20 (e) and (f), when a branch 503 is diverged in a higher order, according to the present invention, the length of the branch 503 is relatively short. Accordingly, of the light emitted from a light emission point N, not only a light beam f steered upward and light beams i, g steered sidewise but also a light beam h emitted in the longitudinal direction of the branch easily reach an end 503a, thus allowed to go out. As a result, ineffective light emission decreases relative to the prior art, such that the external quantum efficiency is improved to about 1.5 times.

When the ends of the highest-order branches of the surface electrode and the semiconductor layer are in electrical contact with each other while the rest of the surface electrode and the semiconductor layer are not, any portion underneath the ends of the surface electrode out of the semiconductor layer becomes a light emission point. Accordingly, the light emitted from the light emission point easily reaches the light emission face (mesa slant face), which leads to a further improved external quantum efficiency.

It is to be noted that this invention can be applied not only to AlGaInP series LEDs but also to commonly-used AlGaAs-, GaP-, ZnSe- (ZnCdSe-), ZnS-, GaN-, SiC-series and other like LEDs. This contributes to improvement in the characteristics of various types of LEDs.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 12(a), 12(b), and 12(c) are views showing a surface and a cross section of a ZnCdSe series LED according to a fifth embodiment of the invention;

FIGS. 14 (a) and 14(b) are views showing a surface main-part and a cross section of an AlGaInP series LED according to a seventh embodiment of the invention; FIGS. 15 (a), 15(b) and 15(c) are views for explaining the function of the fourth to seventh embodiments of the invention;

FIGS. 19(a), 19(b), and 19(c) are views showing a surface and a cross section of an AlGaInP series LED according to a tenth embodiment of the invention.

DETAILED DESCRIPTION OF THE PREFERRED EMBODIMENTS

First Embodiment

Figure 1:
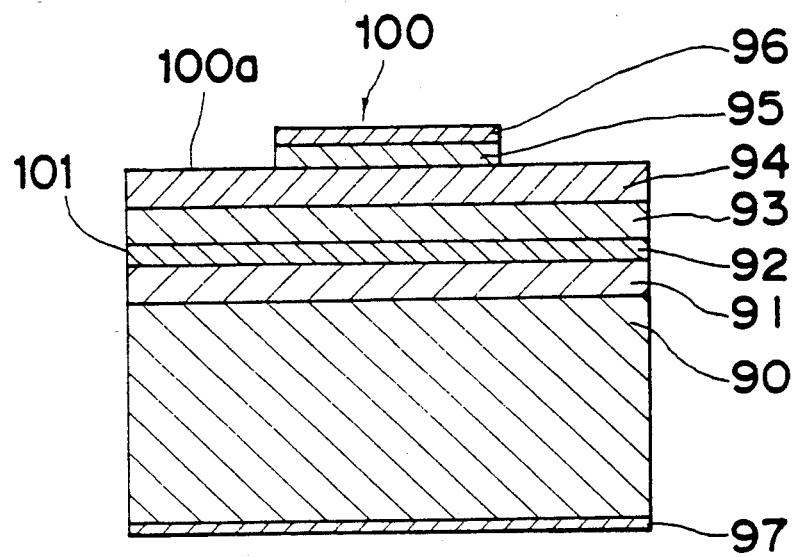
FIG. 1 is a sectional view of a prior-art AlGaIn series LED.
Figure 2:
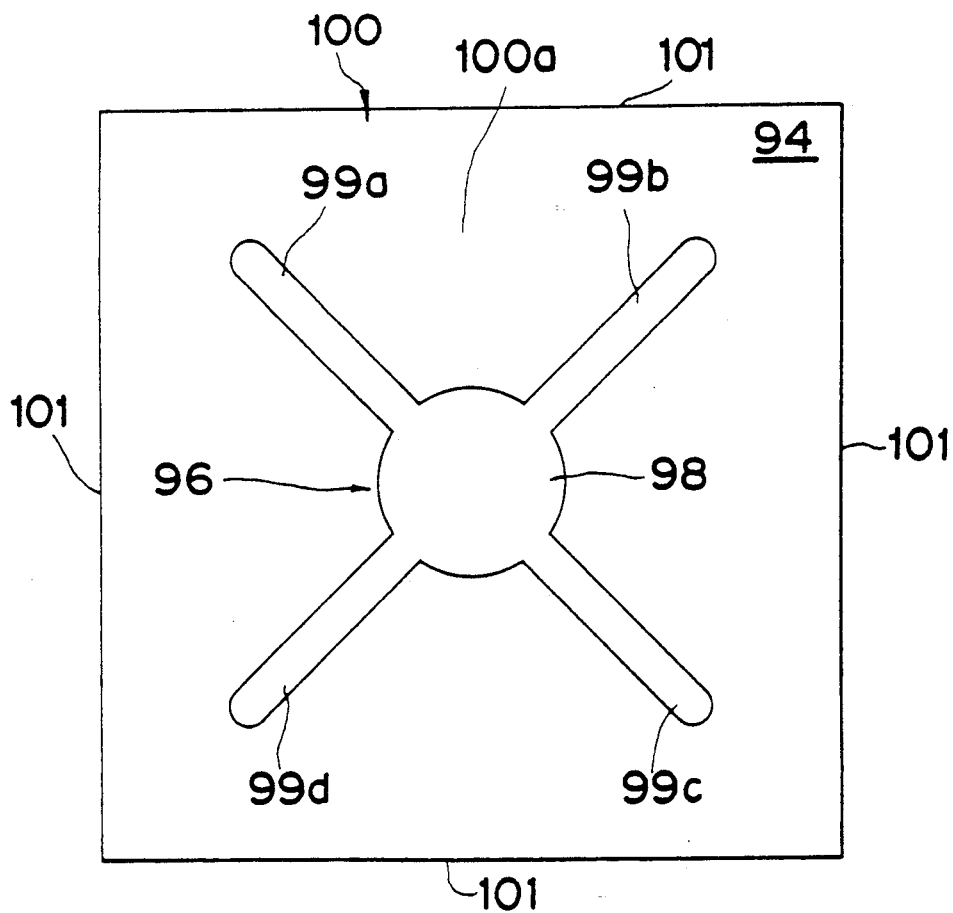
FIG. 2 is a plan view showing the prior-art AlGaInP series LED.
Figure 3:
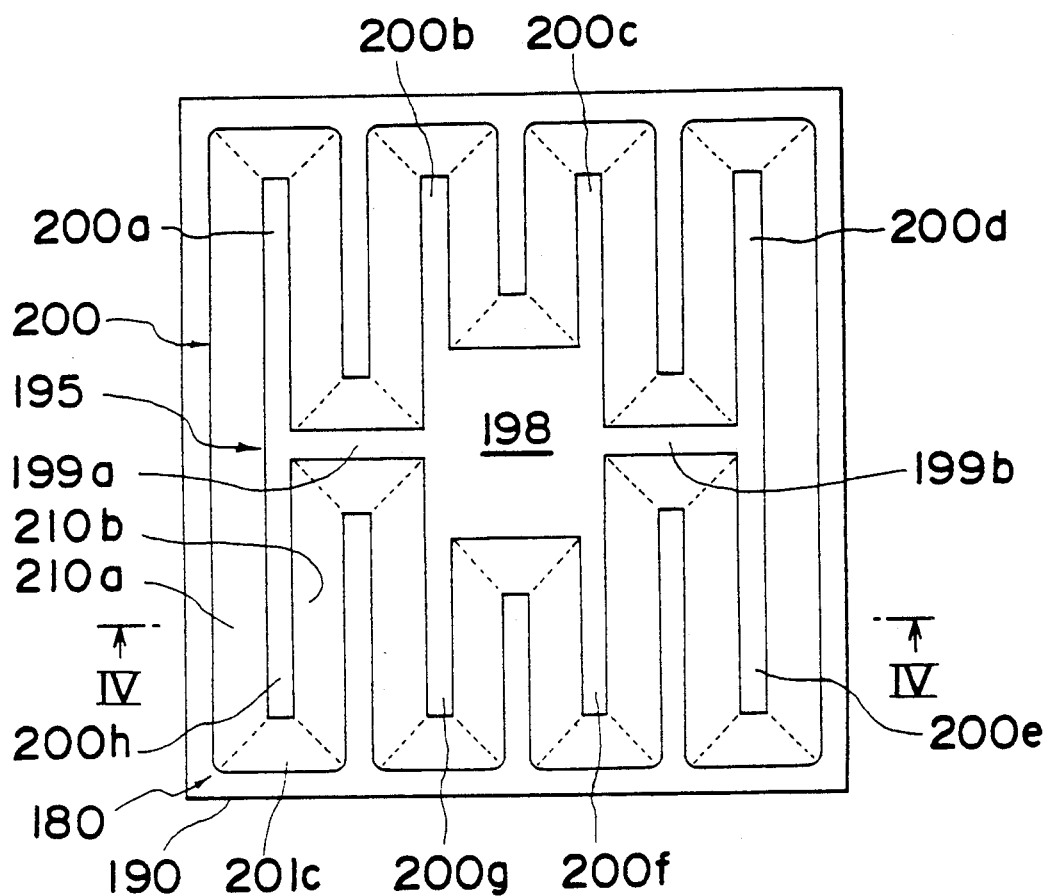
FIG. 3 is a view showing a surface of a prior-art AlGaInP series LED.
Figure 4:
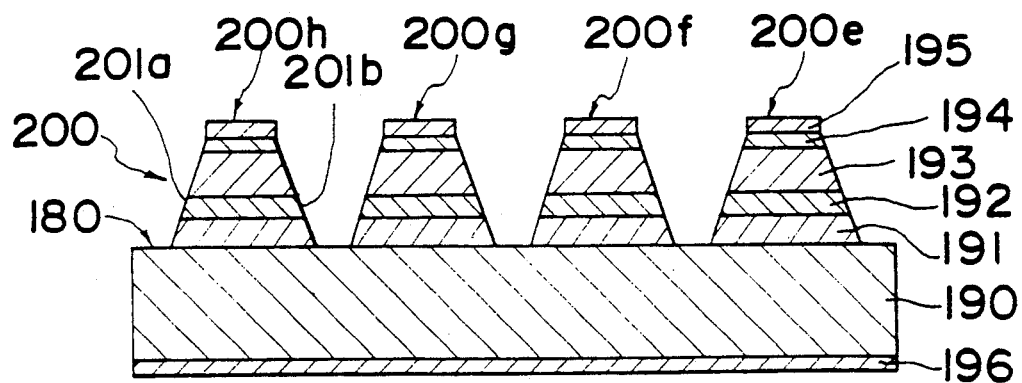
FIG. 4 is a sectional view of the prior-art AlGaInP series LED.
Figure 5:
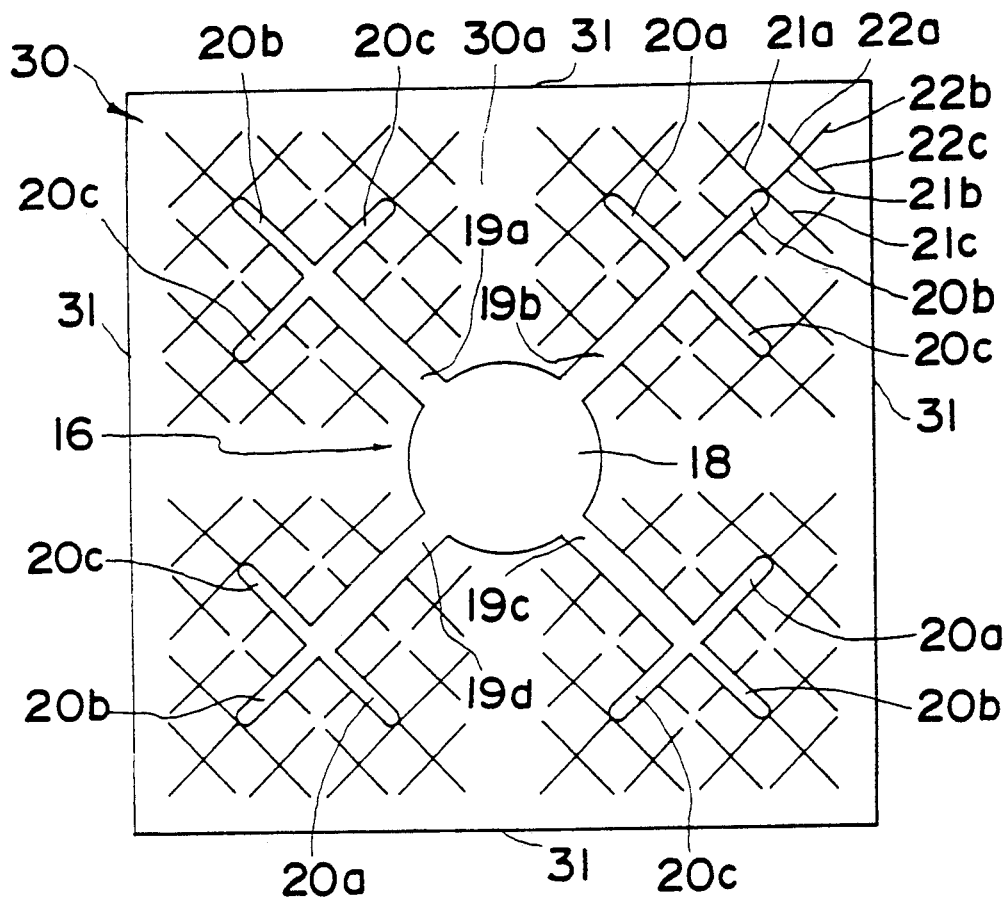
FIG. 5 is a view showing a surface electrode pattern of an AlGaInP series LED according to a first embodiment of the present invention.
Figure 6:
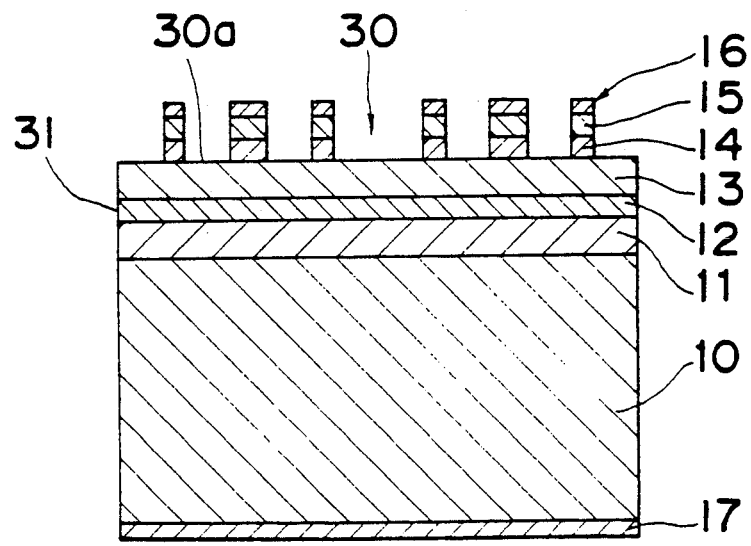
FIG. 6 is a sectional view of the LED.

FIGS. 5 and 6 illustrate a surface and a cross section, respectively, of an AlGaInP series LED according to a first embodiment of the invention. As shown in FIG. 5, an LED surface 30 has an electrode 16. The electrode 16 has in its center a circular pad 18 of specified size for performing wire-bonding. From this pad 18, first-order branches 19a, 19b, 19c, and 19d are extending linearly in the diagonal directions. The first-order branches 19a, 19b, 19c, and 19d are identical to one another in both line width and length. Second-order branches 20a, 20b, and 20c are diverged and extending from the ends of the first-order branches 19a, 19b, 19c, and 19d in three directions, respectively. The angle formed by the first-order and each of second-order branches is 0° or 90°. It is noted that, in actual design, there are unshown imaginary second-order branches which overlap the first-order branches 19a, 19b, 19c, and 19d. The second-order branches 20a, 20b, and 20c are identical to one another in line width and length, each being half the line width and both length of the first-order branches. Also, from the ends of the second-order branches 20a, 20b, and 20c, third-order branches 21a, 21b, and 21c branch and extend linearly in three directions, respectively. The angle formed by the second-order and each of third-order branches is 0° or 90°. Also, the third-order branches 21a, 21b, and 21c are identical to one another in line width and length, each being half the line width and length of the second-order branches. It is noted that the reason why other third-order branches are extending from intermediate points of the first-order branches 19a, 19b, 19c, and 19d is that there are unshown second-order branches which overlap the first-order branches 19a, 19b, 19c, and 19d. Further, from the ends of the third-order branches 21a, 21b, and 21c, fourth-order branches 22a, 22b, and 22c are extending linearly in three directions, respectively. The angle formed by the third-order and each of fourth-order branches is 0° or 90°. The fourth-order branches 22a, 22b, and 22c are identical to one another in line width and length, each being half the line width and length of the third-order branches 21a, 21b, and 21c.

As shown above, the electrode 16 has the same number of branches at any divergence, thus being of a self-similar configuration, namely fractal configuration, in which the relationship between adjoining lower- and higher-order branches is that 'X'-shaped four ends each have another half-in-length 'X' combined therewith in regular, analogous fashion. Accordingly, pattern designing can be easily made. Moreover, the approximately entire region of a semiconductor chip surface 30 can be covered in a tree-like form without causing higher-order branches to overlap with one another. Furthermore, since lower-order branches are wired at relatively larger widths, the wiring resistance can be suppressed to lower ones. This is due to the fact that the lower the number of order, the larger the amount of current flowing therethrough. However, if the wiring resistance is enough small for a narrow wiring width, there is no need of broadening the wiring width.

As shown in FIG. 6, the electrode 16 is provided on the surface 30 of an AlGaInP series semiconductor chip, as described later. This LED is fabricated in the following way. First, over all on a rear face of an n-type GaAs substrate 10 are formed successively an n-type AlGaInP clad layer 11, an undoped light-emitting layer 12, a p-type AlGaInP clad layer 13, a p-type AlGaAs contact layer 14, a p-type GaAs contact layer 15, and an electrode 16, by the MOCVD (Metal Organic Chemical Vapor Deposition) method. Next, by photolithography, the electrode 16 is patterned by removing its part together with the contact layers 14 and 15 so as to be shaped as shown in FIG. 5. Thereafter, an electrode 17 is also formed on the rear face of the substrate 10. It is to be noted that the p-type AlGaAs contact layer 14 is provided only underneath the electrode 16, unlike the prior art, the layer 14 not serving as a current diffusion layer.

As stated above, since the AlGaInP series LED has the semiconductor chip surface 30 covered with the electrode 16 in a tree-like form, the current can be diffused throughout the semiconductor chip even without providing a current diffusion layer, allowing the current diffusion resistance to be decreased substantially. Accordingly, light emission in a region 30a that is not covered with the electrode 16 can be made greater in amount relative to ineffective light emission underneath the electrode 16. As a result, the light easily goes out of the LED, which leads to improved external quantum efficiency. Also, by virtue of the arrangement that no current diffusion layer is provided, even shorter-wavelength light could be free from light absorption. In actual characteristic measurement, the light emission wavelength was 570 nm (yellowish green) and the external quantum efficiency was 1.5%.

The pad 18 may also be positioned at a peripheral part, without being limited to the center, of the chip surface 30.

The pattern configuration of the electrode 16 may also be formed by the so-called mask deposition (deposition using a metal mask having an opening identical in shape to the electrode 16), not by etching.

The material of the LED is not limited to AlGaInP, but may be a III - V group compound semiconductor such as AlGaAs, GaAsP, GaP, AlGaN, and GaInAsP, a II - VI group compound semiconductor such as ZnCdSSe and ZnCdSeTe, or a chalcopyrite series semiconductor such as CuAlSSe and CuGaSSe.

The material of the substrate is not limited to GaAs, but may be GaP, InP, sapphire, or the like, either transparent or opaque with respect to light emission wavelength. The conductive type of the substrate may be either n-type or p-type.

Although the electrode 16 having branches on the side of the semiconductor chip surface 30 side has been provided in this embodiment, branches are further provided also to the rear-face electrode 17 on the rear face of the substrate when a substrate transparent with respect to light emission wavelength is used. This arrangement allows the light outgoing efficiency to be further improved.

The junction of the interface of the light-emitting layer 12 is not limited to the double-hetero junction, but may be a single-hetero junction or a homo junction.

Although the semiconductor layers 11, ..., 15 have been formed by the MOCVD (Metal Organic Chemical Vapor Deposition) method, yet they may be also by the MBE (Molecular Beam Epitaxy), VPE (Vapor Phase Epitaxy), LPE (Liquid Phase Epitaxy), or other like methods. The pn junction may be formed either during the crystal growth or by diffusing the dopant after crystal growth.

Second Embodiment

Figure 7:
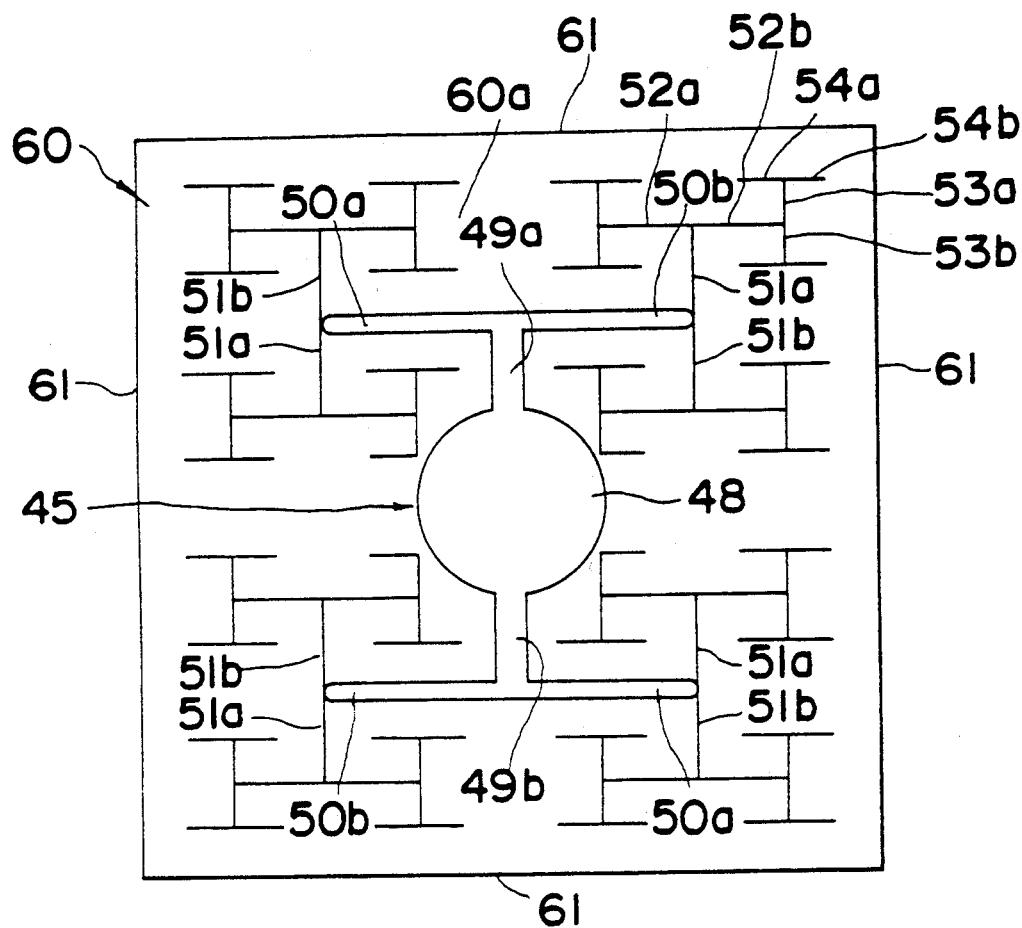
FIG. 7 is a view showing a surface electrode pattern of an AlGaAs series LED according to a second embodiment of the invention.
Figure 8:
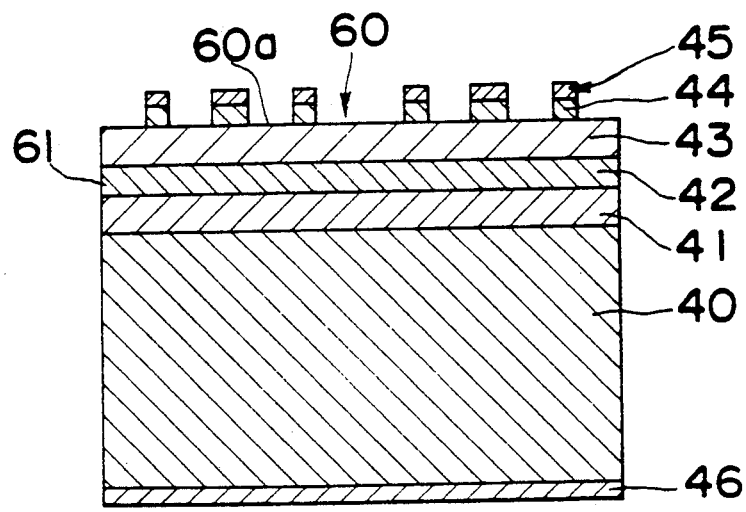
FIG. 8 is a sectional view of the LED.

FIGS. 7 and 8 illustrate a surface and a cross section, respectively, of an AlGaAs series LED according to a second embodiment of the invention. As shown in FIG. 7, an electrode 45 provided on a semiconductor chip surface 60, as described later, has an approximately circular pad 48, first-order branches 49a and 49b linearly extending from the pad 48, second-order branches 50a and 50b, third-order branches 51a and 51b, fourth-order branches 52a and 52b, fifth-order branches 53a and 53b, and sixth-order branches 54a and 54b. The branches form a fractal configuration in which 'H'-shaped four ends each have another half-in-length 'H' repeatedly combined therewith. In this example, various-order branches are formed by lines parallel to four side lines of a square semiconductor chip, thus facilitating the pattern designing.

As shown in FIG. 8, the electrode 45 is provided on the AlGaAs series semiconductor chip surface 60. To fabricate this semiconductor chip, first on an n-type GaAs substrate 40 are formed an n-type AlGaAs layer 41, a p-type AlGaAs light-emitting layer 42, a p-type AlGaAs layer 43, and a p-type GaAs contact layer 44. Subsequently an electrode 45 is formed on the surface of the chip and an electrode 46 on the rear face thereof, all over. Then the contact layer 44 and the electrode 45 are patterned by etching part of them so as to be shaped as shown in FIG. 7.

Since this AlGaAs series LED has the semiconductor chip surface 60 covered with the electrode 45 in a tree-like form, the external quantum efficiency can be improved, as in the first embodiment. Also, since no current diffusion layer is provided, even shorter-wavelength light could be free from light absorption.

Third Embodiment

Figure 9:
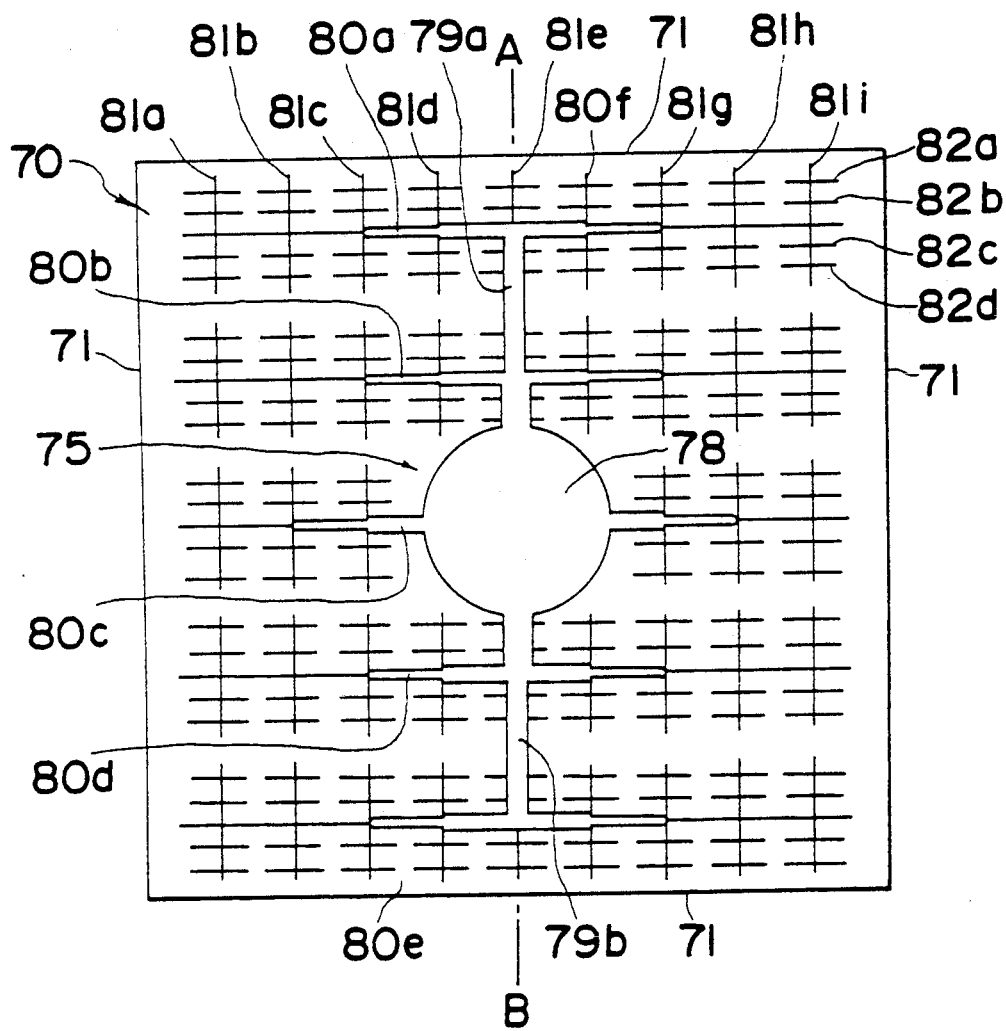
FIG. 9 is a view showing a surface electrode pattern of an AlGaInP series LED according to a third embodiment of the invention.

FIG. 9 illustrates a surface of an AlGaInP series LED according to the third embodiment of the invention. An electrode 75 provided on a semiconductor chip surface 70 has an approximately circular pad 78, first-order branches 79a and 79b, second-order branches 80a, 80b, 80c, 80d, and 80e, third-order branches 81a, 81b, 81c, 81d, 81e, 81f, 81g, 81h, and 81i diverged from the second-order branches 80a, ... 80e, and fourth-order branches 82a, 82b, 82c, and 82d diverged form the third-order branches 81a, ..., 81i. In more detail, first-order branches 79a and 79b are provided on a line AB parallel to a side face 71 and passing through the pad 78, and then five second-order branches 80a, ..., 80e are provided perpendicularly to the first-order branches 79a and 79b. Further, nine third-order branches 81a, ..., 81i are provided perpendicularly to the second-order branches 80a, ..., 80e. It is noted that these third-order branches are actually not formed at portions where they overlap the pad 78 or the first-order branches 79a and 79b. Furthermore, fourth-order branches 82a, ..., 82d are provided perpendicularly to the third-order branches 81a, ..., 81i. The above-mentioned various-order branches are particularly made thicker at portions on the pad 78 side where a greater amount of current flows. This embodiment is, in its narrow sense, no fractal because the number of branches differs depending on the number of order for divergence, but the design concept is rather fractal.

The internal structure of this AlGaInP series LED is similar to that of the first embodiment, its description being omitted. Since the AlGaInP series LED has the semiconductor chip surface 70 covered with the electrode 75 in a tree-like form, the external quantum efficiency can be improved as in the first and second embodiments. Further, since no current diffusion layer is provided, even shorter-wavelength light could be free from light absorption.

As apparent from the above description, since the light-emitting diodes of the first to third embodiments are so arranged that the electrode provided on the semiconductor chip at least has a pad, first-order branches linearly extending from the pad, second-order branches diverged and linearly extending from the first-order branches, and third-order branches further diverged and linearly extending from the second-order branches, a semiconductor chip surface can be covered with the various-order branches in a tree-like form, allowing the current diffusion resistance to be substantially reduced. Accordingly, light emission in the region that is not covered with the electrode can be greater in amount relative to ineffective light emission underneath the electrode, which leads to improved external quantum efficiency. Yet further, the current diffusion layer can be omitted, thus allowing even shorter-wavelength light to go out at high efficiency.

When the line width of the various-order branches decreases at a constant rate as the number of order increases, the current diffusion resistance can be decreased effectively without much increasing the area underneath the electrode out of the semiconductor chip surface, which leads to further improved external quantum efficiency. Furthermore, wiring resistance can be suppressed from increasing, and the electrode pattern can be easily designed.

When the length of the various-order branches decreases at a constant rate as the number of order increases, higher-order branches can be prevented from overlapping with one another, so that the semiconductor chip surface can be approximately entirely covered in a tree-like form. Yet further the electrode pattern can be easily designed.

Similarly, when the angle formed by every adjacent branches is 0° or 90°, higher-order branches can be prevented from overlapping with one another, so that the semiconductor layer surface can be approximately entirely covered in a tree-like form. Yet further the electrode pattern can be easily designed.

Fourth Embodiment

Figure 10:
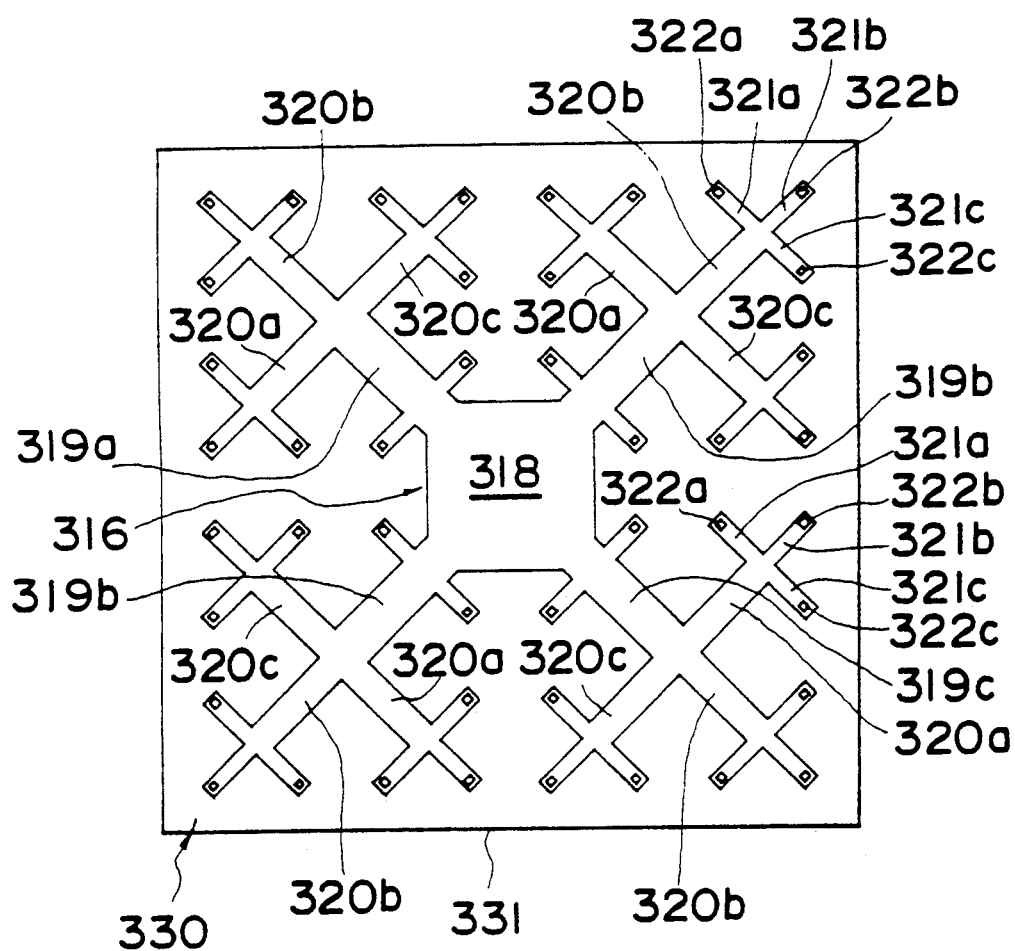
FIG. 10 is a view showing a surface of an AlGaInP series LED according to a fourth embodiment of the invention.
Figure 11A:
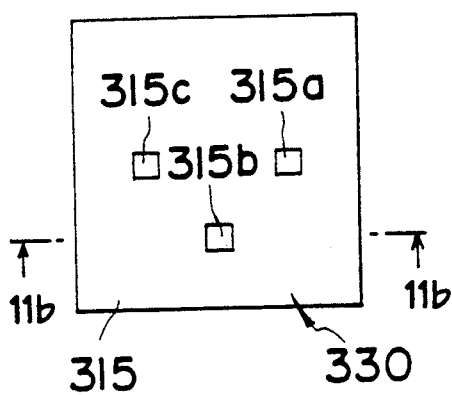
FIGS. 11(a), 11(b), 11(c), and 11(d) are views showing the process for fabricating the LED.
Figure 11B:
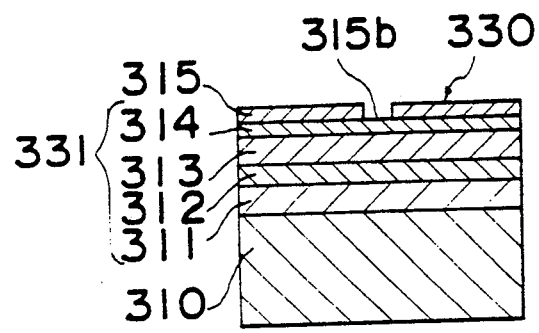
Figure 11C:
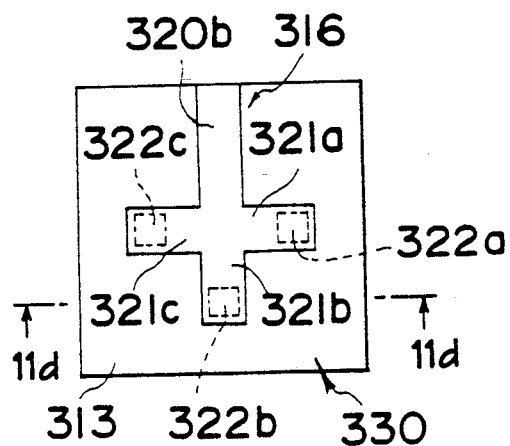
Figure 11D:
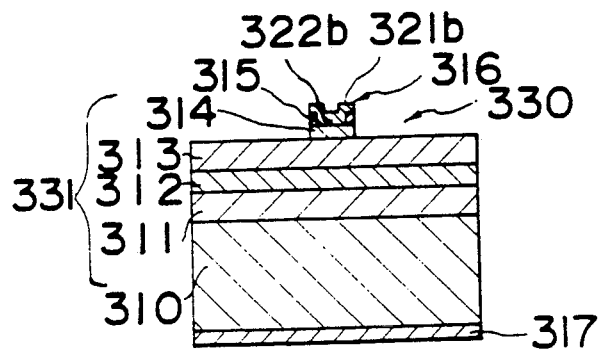

FIG. 10 illustrates a surface of an AlGaInP series LED according to a fourth embodiment of the invention. As shown in FIGS. 10 and 11, on a semiconductor substrate 310 there are provided a semiconductor layer 331 including a light-emitting layer, and a surface electrode 316. The surface electrode 316 has in its center an approximately rectangular pad 318 for wire bonding. From this pad 318, first-order branches 319a, 319b, 319c, and 319d are extending linearly in diagonal directions. The first-order branches 319a, 319b, 319c, and 319d are identical to one another in line width and length. From the ends of the first-order branches 319a, 319b, 319c, and 319d, second-order branches 320a, 320b, and 320c are diverged and extending in three directions, respectively. The angle formed by the first-order and each of second-order branches is 0° or 90°. It is noted that, in actual design, there are unshown second-order branches which overlap the first-order branches 319a, 319b, 319c, and 319d. The second-order branches 320a, 320b, and 320c are identical to one another in line width and length, each being half the line width and length of the first-order branches. Also, from the ends of the second-order branches 320a, 320b, and 320c, third-order branches 321a, 321b, and 321c are diverged and extending linearly in three directions, respectively. The angle formed by the second-order and each of third-order branches is 0° or 90°. Also, the third-order branches 321a, 321b, and 321c are identical to one another in line width and length, each half the line width and length of the second-order branches. It is noted that the reason why other third-order branches are extending from intermediate points of the first-order branches 319a, 319b, 319c, and 319d is that there are unshown ends of second-order branches which overlap the first-order branches 319a, 319b, 319c, and 319d. At the ends of the third-order branches 321a, 321b, and 321c there are provided contact portions 322a, 322b, and 322c for making ohmic contact with an underlying semiconductor layer 331. Meanwhile, the rest of the surface electrode 316 other than the contact portions 322a, 322b, and 322c is in no electrical contact with the semiconductor layer 331 (due to an Al$_2$O$_3$ insulating layer 15, later described).

As shown above, the surface electrode 316 has the same number of branches at any divergence, thus being of a self-similar configuration, namely fractal configuration, in which the relationship between adjoining lower- and the higher-order branches is that 'X'-shaped four ends each have another half-in-length 'X' combined therewith in regular, analogous fashion. Accordingly, pattern designing can be easily made. Moreover, the approximately entire region of the surface 330 of the semiconductor layer 331 can be covered in a tree-like form without causing higher-order branches to overlap with one another. Furthermore, since lower-order branches are wired at relatively larger widths, the wiring resistance can be suppressed to lower ones. This is due to the fact that the lower the number of order, the larger the amount of current flowing therethrough.

FIGS. 11(a) to (d) illustrate the process for fabricating the LED. FIGS. 11 (a) and (c) depict part of the semiconductor layer surface 330 (specifically, the vicinity of the end of a second-order branch 320b) by way of example while FIGS. 11 (b) and (d) depict cross sections taken along the lines B—B and D—D in FIGS. 11 (a) and (c), respectively. This LED is fabricated in the following way.

(1) First, as shown in FIGS. 11 (a) and (b), on an n-type GaAs substrate 310 are deposited over all an n-type AlGaInP clad layer 311 an undoped AlGaInP light-emitting layer 312, a p-type AlGaInP clad layer 313, a p-type GaAs contact layer 314, successively, by the MOCVD (Metal Organic Chemical Vapor Deposition) method, and moreover formed an Al$_2$O$_3$ insulating layer 315. A semiconductor layer 331 is composed of those layers 311, 312, 313 and 314. Then, by photolithography, openings 315a, 315b, and 315c are formed at specified points of the Al$_2$O$_3$ insulating layer 315.

(2) Next, as shown in FIGS. 11 (c) and (d), a surface electrode 316 is deposited over all on the product of step (1) and subsequently, by performing photolithography and etching, the surface electrode 316, the Al$_2$O$_3$ insulating layer 315, and the p-type GaAs contact layer 314 are patterned into the fractal configuration as previously described. The etching may be either wet etching or RIBE (Reactive Ion-Beam Etching). By doing this, the surface electrode 316 and the p-type contact layer 314 (therefore, the semiconductor layer 331) are put into ohmic contact with each other at the contact portions 322a, 322b, and 322c through the openings 315a, 315b, and 315c. In the region of the surface electrode 316 other than the contact portions 322a, 322b, and 322c, on the other hand, the surface electrode 316 and the semiconductor layer 331 are electrically isolated from each other by the Al$_2$O$_3$ insulating layer 315. It is noted that the p-type GaAs contact layer 314 is provided only underneath the surface electrode 316, not serving as a current diffusion layer.

(3) Finally, a rear-face electrode 317 is formed over all on the rear face of the substrate 310 (the fabrication completed).

As stated above, this AlGaInP series LED has the semiconductor layer surface 330 covered with the surface electrode 316 in a tree-like form. Moreover, the surface electrode 316 and the semiconductor layer 331 are put into electrical contact with each other through the contact portions 322a, 322b, and 322c at the ends of the third-order (highest-order) branches 321a, 321b, and 321c, while the surface electrode 316 and the semiconductor layer 331 are electrically isolated from each other at the rest of the surface electrode 316 other than the ends thereof. Thus, the current can be diffused throughout the semiconductor layer without providing a current diffusion layer, allowing the current diffusion resistance to be decreased substantially. As a result of this, light emission in the region that is not covered with the surface electrode 316 can be made greater in amount relative to ineffective light emission underneath the electrode 316. Accordingly, the light easily goes out of the LED, which leads to improved external quantum efficiency. Also, by virtue of the arrangement that no current diffusion layer is provided, even shorter-wavelength light could be free from light absorption. In actual characteristic measurement, the light emission wavelength was 570 nm (yellowish green) and the external quantum efficiency was 2.0%.

It is noted that although the contact portions 322a, 322b, and 322c have been provided in this embodiment only at the ends of the third-order branches 321a, 321b, and 321c, yet they are not limited to this. For example, they may be provided also at intermediate points of the second-order branches 320a, 320b, and 320c as shown in FIG. 10. In this case, the current-light conversion efficiency itself slightly lowers, but a large amount of current is allowed to flow so that the total amount of light emission per semiconductor layer can be increased.

Although the width of the contact portions 322a, 322b, and 322c has been made narrower than that of the third-order branches 321a, 321b, and 321c in this embodiment (FIG. 11 (c)), it is not limited to this but may be wider conversely. In such a case, the electrical resistance at the contact portions can be reduced.

The pad 318 may also be positioned at a peripheral part, without being limited to the center, of the semiconductor layer surface 330.

The pattern configuration of the surface electrode 316 may also be formed by the so-called mask deposition (deposition using a metal mask having openings identical in shape to the surface electrode 316), not by etching.

The material of the LED is not limited to AlGaInP, but may be a III - V group compound semiconductor such as AlGaAs, GaAsP, GaP, AlGaN, and GaInAsP, a II - VI group compound semiconductor such as ZnSe, ZnCdSSe, and ZnCdSeTe, or a chalcopyrite series semiconductor such as CuAlSSe and CuGaSSe.

The material of the substrate is not limited to GaAs, but may be GaP, InP, sapphire, or the like, either transparent or opaque with respect to light emission wavelength. The conductive type of the substrate may be either n-type or p-type.

Although the surface electrode 316 having branches on the semiconductor layer surface 330 side has been provided in this embodiment, branches are further provided also to the rear-face electrode 317 when a substrate transparent with respect to light emission wavelength is used. This arrangement allows the light outgoing efficiency to be further improved.

The junction of the interface of the light-emitting layer 312 is not limited to the double-hetero junction, but may be a single-hetero junction or a homo junction.

The material of the insulating layer 315 is not limited to $Al_2O_3$, but may also be $SiO_2$ or $Si_3N_4$ or the like.

Although the semiconductor layers 311, ..., 315 have been formed by the MOCVD (Metal Organic Chemical Vapor Deposition) method, yet they may be also by the MBE (Molecular Beam Epitaxy), VPE (Vapor Phase Epitaxy), LPE (Liquid Phase Epitaxy), or other like methods. The pn-junction may be formed either during the crystal growth or by diffusing the dopant after crystal growth.

Furthermore, as the material of the surface electrode (p-side electrode) 316 are available AuZn, InAu, Cr/Au, Mo/Au, Ti/Pt/Au, Au, Al, In, ITO (indium tin oxide), $InO_2$, $SnO_2$, and their stacked films. As the material of the rear-face electrode (n-side electrode) 317, on the other hand, are available AuGe/Ni, AuSn, AuSi, Mo/Au, Au, Al, In, ITO and their stacked films.

Fifth Embodiment

FIG. 12 illustrates a ZnCdSe series LED according to a fifth embodiment of the invention. FIG. 12 (a) shows the whole surface of the LED while FIG. 12 (b) shows part thereof (electrode end) by way of example. Further, FIG. 12 (c) is a sectional view taken along the line C—C in FIG. 12 (b).

As shown in FIG. 12 (a), this LED has on a surface 350 of a chip a semiconductor layer 351 including a light-emitting layer, and a surface electrode 347. The surface electrode 347 has, as its pattern, an approximately rectangular pad 352, first-order branches 353a and 353b linearly extending from the pad 352, second-order branches 354a and 354b, third-order branches 355a and 355b, fourth-order branches 356a and 365b, fifth-order branches 357a and 357b, and sixth-order branches 358a and 358b. The various-order branches form a fractal configuration in which 'H'-shaped four ends each have another half-in-length 'H' repeatedly combined therewith. In this example, the various-order branches are formed by lines parallel to four side lines of the chip of square, thus facilitating the pattern designing. Further, the approximately entire region of the chip surface 350 can be covered in a tree-like form without causing higher-order branches to overlap with one another. It is noted that sixth-order branches arranged in the vicinity of the pad 52 in actual design are omitted here. At the ends of the sixth-order branches 358a and 358b, there are provided contact portions 359a and 359b for making ohmic contact with the underlying semiconductor layer 351. Meanwhile, the rest of the surface electrode 347 other than the contact portions 359a and 359b is in a state in which a Schottky barrier are yielded on the surface of the semiconductor layer 351.

This LED is fabricated in the following way.

(1) First, as shown in FIG. 12 (c), on an n-type GaAs substrate 340 are deposited an n-type InGaAs buffer layer 341, an n-type ZnSe clad layer 342, an undoped ZnCdSe strained quantum well light-emitting layer 343, a p-type ZnSe clad layer 344, a p-type AlGaAs contact layer 345, and a p-type GaAs contact layer 346, successively, by the MBE method. These layers 341, 342, 343, 344, 345 and 346 constitute a semiconductor layer 351.

(2) Next, by performing photolithography and etching, portions corresponding to the contact portions 359a and 359b out of the contact layers 345 and 346 are left while the p-type ZnSe clad layer 344 is exposed to the chip surface 350.

(3) Next, a surface electrode 347 is formed on the surface of the semiconductor layer 351 and a rear-face electrode 348 is on the rear face of the substrate 340, over all. Then the surface electrode 347 is partially etched into the pattern so as to be of the fractal configuration as shown in FIG. 12 (the fabrication completed). As a result, only the end portions of the sixth-order (highest-order) branches 358a and 358b of the surface electrode 347 are put into ohmic contact with the semiconductor layer 351, the rest other than the ends being finished into a state in which a Schottky barrier are yielded for the semiconductor layer 351 (p-type ZnSe clad layer 344).

As stated above, since the ZnCdSe series LED has the chip surface 350 covered with the surface electrode 347 in a tree-like form, the external quantum efficiency can be improved. Further, since the end portions of the sixth-order (highest-order) branches 358a and 358b and the semiconductor layer 351 are put into successful ohmic contact with each other through the contact portions 359a and 359b while the rest other than the end portions and the semiconductor layer 351 are brought into a state in which the current is suppressed from flowing by the Schottky barrier (i.e. a state in which current will not flow unless a certain high level of voltage is applied), the current can be injected only at the end portions of the surface electrode 351. Accordingly, the light easily goes out of the LED, which leads to further improved external quantum efficiency. Also, by virtue of the arrangement that no current diffusion layer is provided, even shorter-wavelength light could be free from light absorption.

The material of the substrate is not limited to GaAs, but may be ZnSe or the like, either opaque or transparent with respect to light emission wavelength. The conductive type of the substrate may be either n-type or p-type.

The material of the LED is not limited to ZnCdSe, but may be a III - V group compound semiconductor such as AlGaInP, AlGaAs, GaAsP, GaP, AlGaN, and GaInAsP, a II - VI group compound semiconductor such as ZnSe, ZnCdSSe, and ZnCdSeTe, or a chalcopyrite series semiconductor such as CuAlSSe and CuGaSSe.

Although the light-emitting layer 343 has been formed from $Zn_{1-x}Cd_xSe$ (x=0.2) in this embodiment, the value of x is not particularly limited to this. It may be, for example, ZnSe of x=0. Also, the light-emitting layer may be of ZnSe/ZnCdSe multiple-quantum-well structure.

Although the buffer layer 341 has been formed from n-type InGaAs in this embodiment, it may also be from an n-type ZnSSe or n-type ZnS/ZnSe strained layered superlattice layer.

Further, although the semiconductor layers 341, ..., 345 have been formed by the MBE method in this embodiment, yet they may be formed also by MOCVD, VPE, LPE, or other like methods. The pn-junction may be formed either during the crystal growth or by diffusing the dopant after crystal growth.

Sixth Embodiment

Figure 13A:
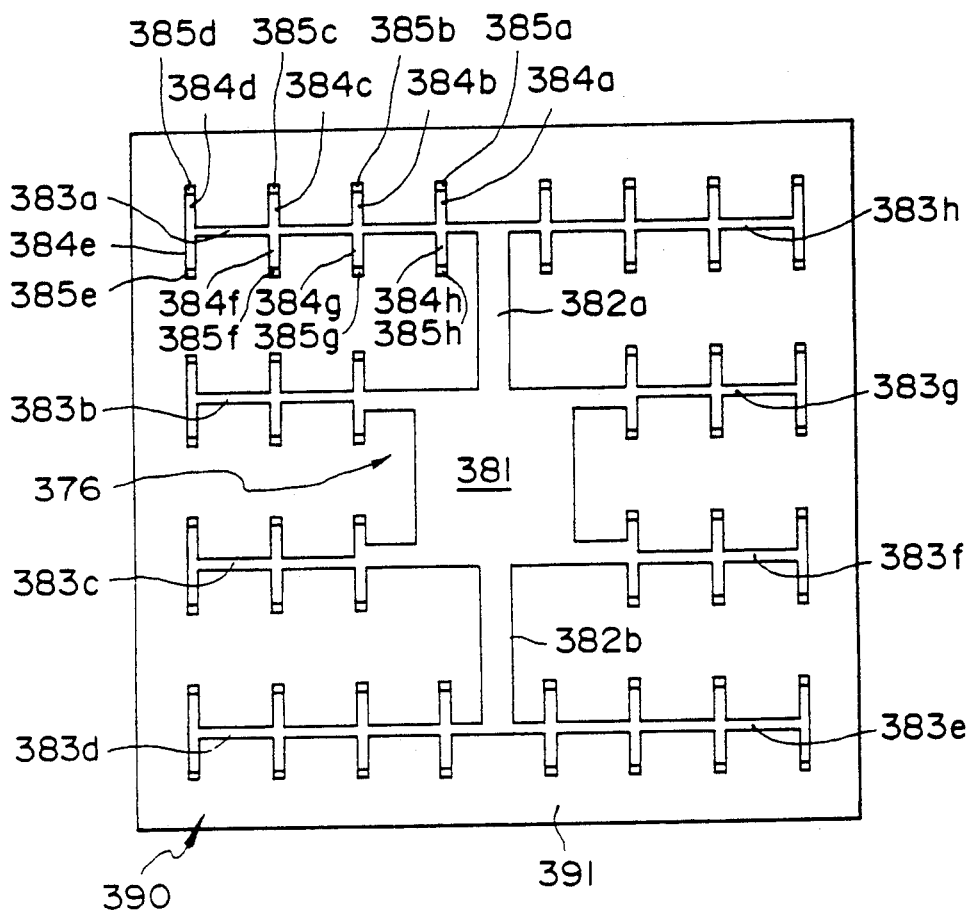
FIGS. 13(a), 13(b), and 13(c) are views showing a surface and a cross section of an AlGaInP series LED according to a sixth embodiment of the invention.
Figure 13B:
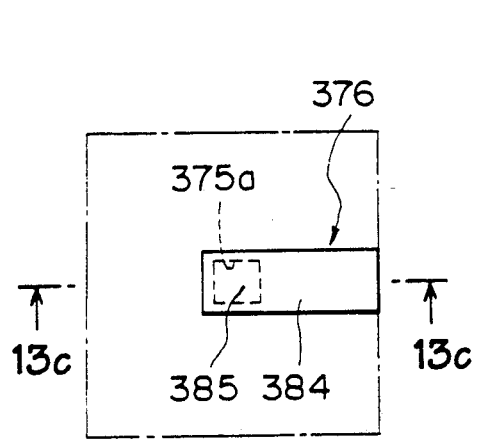
Figure 13C:
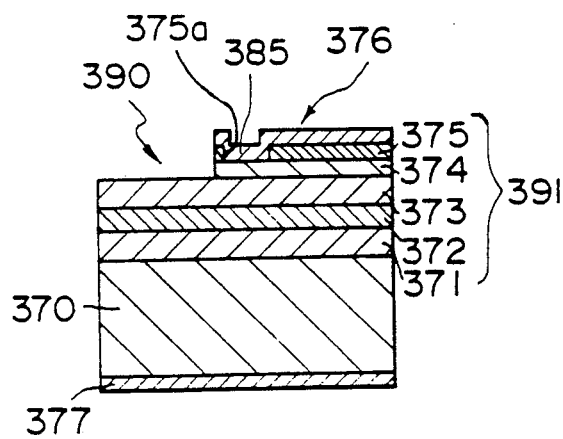

FIG. 13 illustrates an AlGaInP series LED according to a sixth embodiment of the invention. FIG. 13 (a) depicts the entire surface of the LED and FIG. 13 (b) shows its part (electrode end) by way of example. FIG. 13 (c) depicts a cross section taken along the line C—C in FIG. 13 (b).

As shown in FIG. 13 (a), this LED presents on a surface 390, a semiconductor layer 391 including a light-emitting layer, and a surface electrode 376. The surface electrode 376 has, as its pattern, an approximately rectangular pad 381, first-order branches 382a and 382b, second-order branches 383a, 383b, 383c, 383d, 383e, 383f, 383g, and 383h, and third-order branches 384a, 384b, 384c, 384d, 384e, 384f, 384g, and 384h diverged from the second-order branches 383a, ..., 383h. More specifically, the surface electrode 376 has first-order branches 382a and 382b on a line parallel to side faces of the LED and passing through the pad 381, eight second-order branches 383a, ..., 383h perpendicular to the first-order branches 382a and 382b, and further eight third-order branches 384a, ..., 384h perpendicular to the second-order branches 383a, ..., 383h. It is noted that the third-order branches are actually not formed at portions where they overlap the pad 381. The lower the number of order of branches, the larger the line width of the various-order branches. It is because that the lower the number of order of branches, the larger the amount of current flowing therethrough. In this embodiment, the configuration is, in its narrow sense, not fractal because the number of branches differs depending on the number of order for divergence, but the design concept is rather fractal. At the ends of the third-order branches 384a, ..., 384h, there are provided contact portions 385a, ..., 385h for making ohmic contact with the underlying semiconductor layer 391. Meanwhile the rest of the surface electrode 376 other than the contact portions 385a, ..., 385h is not in electrical contact with the semiconductor layer 391.

This LED is fabricated in the following way.

(1) First, as shown in FIGS. 13 (c), on an n-type GaAs substrate 370 are deposited over all an n-type AlGaInP clad layer 371, an undoped AlGaInP light-emitting layer 372, a p-type AlGaInP clad layer 373, a p-type GaAs contact layer 374, an n-type GaAs current blocking layer 375, successively, by the MOCVD (Metal Organic Chemical Vapor Deposition) method. These layers 371, 372, 373, 374 and 375 are included in a semiconductor layer 391.

(2) Next, by performing photolithography and etching, an opening 375a is formed at a specified point of the n-type GaAs current blocking layer 375.

(3) Then, after a surface electrode 376 is deposited over all on the product of steps (1) and (2), unshown photoresist is provided on the surface electrode 376 and thereafter, by performing photolithography and etching, the surface electrode 376, the n-type GaAs current blocking layer 375, and the p-type GaAs contact layer 374 are pattern processed into the fractal configuration as previously described. The etching may be either wet etching or RIBE (Reactive Ion-Beam Etching). By doing this, the surface electrode 376 and the p-type contact layer 374 (therefore, the semiconductor layer 391) are put into ohmic contact with each other at the contact portion 385 through the opening 375a. In the region of the surface electrode 376 other than the contact portion 385, on the other hand, the surface electrode 376 and the semiconductor layer 391 are prevented from conducting therebetween by the n-type GaAs current blocking layer 375 different in conductive type. It is noted that the p-type GaAs contact layer 374 is provided only underneath the surface electrode 376, not serving as a current diffusion layer.

(4) Finally, a rear-face electrode 377 is formed over all on the rear face of the substrate 370 (the fabrication completed).

As stated above, since this AlGaInP series LED has the surface 390 of the semiconductor layer 391 covered with the surface electrode 376 in a tree-like form, as in the fourth and fifth embodiments, the current can be diffused throughout the semiconductor layer 391 without providing a current diffusion layer, allowing the current diffusion resistance to be reduced substantially. Moreover, the surface electrode 376 and the semiconductor layer 391 are put into ohmic contact with each other through the contact portions 385a, ..., 385h at the ends of the third-order (highest-order) branches 384a, ..., 384h, while the rest of the surface electrode 376 other than the contact portions 385a, ..., 385h and the semiconductor layer 391 are prevented from conducting therebetween by the current blocking layer 375. As a result of this, light emission in the region that is not covered with the surface electrode 376 can be made greater in amount relative to ineffective light emission underneath the surface electrode 376. Accordingly, the light easily goes out of the LED, which leads to improved external quantum efficiency. Also, by virtue of the arrangement that no current diffusion layer is provided, even shorter-wavelength light could be free from light absorption. Further, the process of forming the insulating layer can be omitted, advantageously compared with the fourth embodiment.

Seventh Embodiment

FIG. 14 illustrates an AlGaInP series LED according to a seventh embodiment of the invention. FIG. 14 (a) depicts part of the surface of the LED (electrode end) and FIG. 14 (b) depicts a cross section taken along the line B—B in FIG. 14 (a). This LED presents, on its surface 830, a semiconductor layer 831 including a light-emitting layer, and a surface electrode 816 of the same pattern as the surface electrode 316 in the fourth embodiment (in addition, for simplicity the overall view of the surface of the LED is omitted). At the end of a third-order branch 806 there is provided a contact portion (lower electrode) 805 for making ohmic contact with the underlying semiconductor layer 831. Meanwhile the rest of the surface electrode 816 other than the contact portion 805 is not in electrical contact with the semiconductor layer 831.

This LED is fabricated in the following way.

(1) First, on an n-type GaAs substrate 800 are deposited over all an n-type AlGaInP clad layer 801, an undoped AlGaInP light-emitting layer 802, a p-type AlGaInP clad layer 803, a p-type GaAs contact layer 804, successively, by the MOCVD (Metal Organic Chemical Vapor Deposition) method. These layers 801, 802, . . . , 804 constitute a semiconductor layer 831.

(2) Next, an AnZn layer is deposited on the product of step (1) as the material of the contact portion 805 and the AnZn layer is processed into a rectangular pattern having a narrower width than the end of the surface electrode 816. Subsequently, through heat treatment, the p-type GaAs contact layer 804 and the contact layer 805 are put into ohmic contact with each other.

(3) After depositing an Al layer on the product of step (2) as the material of the surface electrode 816, the Al layer (upper electrode) and the p-type GaAs contact layer 804 are simultaneously patterned into the fractal configuration similar to that in the fourth embodiment, by performing photolithography and etching. By doing this, the surface electrode 816 and the p-type contact layer 804 (therefore, the semiconductor layer 831) are put into ohmic contact with each other through the contact portion 805 at the end of the third-order (highest-order) branch 806. In the region of the surface electrode 816 other than the contact portion 805, on the other hand, the surface electrode 816 and the semiconductor layer 831 are prevented from electrically conducting therebetween. This is due to the fact that the Al layer and the p-type GaAs contact layer are materials which would not make ohmic contact with each other and moreover that they have already been subjected to heat treatment at step (2). It is noted that the p-type GaAs contact layer 804 is provided only underneath the surface electrode 816, not serving as a current diffusion layer.

(3) Finally, a rear-face electrode 807 is formed over all on the rear face of the substrate 800 (the fabrication completed).

As stated above, since this AlGaInP series LED has the surface of the semiconductor layer 831 covered with the surface electrode 816 in a tree-like form, as in each of the foregoing embodiments, the current can be diffused throughout the semiconductor layer 816 without providing a current diffusion layer, allowing the current diffusion resistance to be reduced substantially. Moreover, the surface electrode 816 and the semiconductor layer 831 are put into ohmic contact with each other through the contact portion 805 at the end of the third-order (highest-order) branch 806 while the surface electrode 816 and the semiconductor layer 831 are prevented from making electrical contact with each other at the rest of the surface electrode 816 other than the end. Thus, light emission in the region that is not covered with the surface electrode 816 can be made greater in amount relative to ineffective light emission underneath the electrode 816. Accordingly, the light easily goes out of the LED, which leads to improved external quantum efficiency. Also, the process of forming the insulating layer can be omitted, advantageously compared with the fourth embodiment.

As apparent from the above description, since the light-emitting diodes of the fourth to seventh embodiments are so arranged that the surface electrode has, at least, first-order branches extending from a pad, second-order branches extending from the first-order branches, and third-order branches further extending from the second-order branches, the semiconductor layer surface can be covered with the various-order branches in a tree-like form. Moreover, since the pad portion out of the surface electrode is out of contact with the underlying semiconductor layer while the surface electrode and the semiconductor layer are in contact with each other at the ends of the highest-order branches, the current can be diffused throughout the semiconductor layer without providing a current diffusion layer, allowing the current diffusion resistance to be reduced substantially. Accordingly, light emission in the region that is not covered with the surface electrode can be made greater in amount relative to ineffective light emission underneath the surface electrode. As a result, the light easily goes out of the LED, which leads to improved external quantum efficiency. Yet further, since the current can be sufficiently diffused within the semiconductor layer by virtue of the shape of the surface electrode, the AlGaAs current diffusion layer can be omitted, for example, in an AlGaInP series LED of shorter wavelengths than yellow, thus making it possible to realize a preferable characteristic that there will occur no light absorption even with shorter-wavelength light. The present invention can be applied not only to the AlGaInP series LEDs but also to commonly-used AlGaAs-, GaP-, ZnSe-, GaN-, SiC-series LEDs and others, and especially effective to ZnCdSe series LEDs which are difficult to obtain any low-resistance current diffusion layer.

When the semiconductor layer has, on the surface electrode side, a contact layer made of a material that makes ohmic contact with the surface electrode and moreover an insulating layer is provided between portions of the surface electrode other than the aforementioned end portions and the semiconductor layer, the ends of the highest-order branches of the surface electrode and the semiconductor layer are put into successful electrical contact with each other through the contact layer while the portions of the surface electrode other than the ends and the semiconductor layer are electrically isolated from each other by the insulating layer. Accordingly, the current can be injected only at the end portions of the surface electrode. As a result, the light easily goes out of the LED, which leads to further improved external quantum efficiency.

When the semiconductor layer has, on the surface electrode side, a layer made of a material that yields a Schottky barrier with respect to the surface electrode and moreover has, between the aforementioned layer and the ends of the highest-order branches, a contact layer made of a material that makes ohmic contact with the surface electrode, the ends of the highest-order branches of the surface electrode and the semiconductor layer make successful electrical contact with each other through the contact layer while the portions of the surface electrode other than the ends and the semiconductor layer are brought into a state in which the current is suppressed from flowing by the Schottky barrier (i.e. a state in which current will not flow unless a certain high level of voltage is applied). Accordingly, in practice, the current can be injected only at the end portions of the surface electrode. As a result, the light easily goes out of the LED, which leads to further improved external quantum efficiency.

When the semiconductor layer has, on the surface electrode side, a contact layer made of a material that makes ohmic contact with the surface electrode and having the conductive type of p-type or n-type, and moreover has a current blocking layer having a different conductive type than the aforementioned contact layer between the contact layer and the portions of the surface electrode other than the ends, the ends of the highest-order branches of the surface electrode and the semiconductor layer make successful electrical contact with each other through the contact layer while the portions of the surface electrode other than the ends and the semiconductor layer are blocked from electrically conducting therebetween by the current blocking layer. Accordingly, the current can be injected only at the end portions of the surface electrode. As a result, the light easily goes out of the LED, which leads to further improved external quantum efficiency.

When the surface electrode is composed of an upper electrode provided on the overall region occupied by the surface electrode and made of a material that makes no ohmic contact with the semiconductor layer surface, and a lower electrode provided between the upper electrode and the semiconductor layer surface at the ends of the semiconductor layer surface and the highest-order branches and made of a material that makes ohmic contact with the semiconductor layer surface, the ends of the highest-order branches of the surface electrode and the semiconductor layer make successful electrical contact with each other through the lower electrode while the rest of the surface electrode other than the ends and the semiconductor layer are electrically non-conducting. Accordingly, the current can be injected only at the end portions of the surface electrode. As a result, the light easily goes out of the LED, which leads to further improved external quantum efficiency.

When the line width of the various-order branches decreases as the number of order increases, the line width of lower-order branches is relatively wide, suppressing the wiring resistance from increasing. Also, by arranging the line width of the various-order branches so as to decrease at a constant rate as the number of order increases, pattern designing of the surface electrode can be simplified.

Eighth Embodiment

Figure 16:
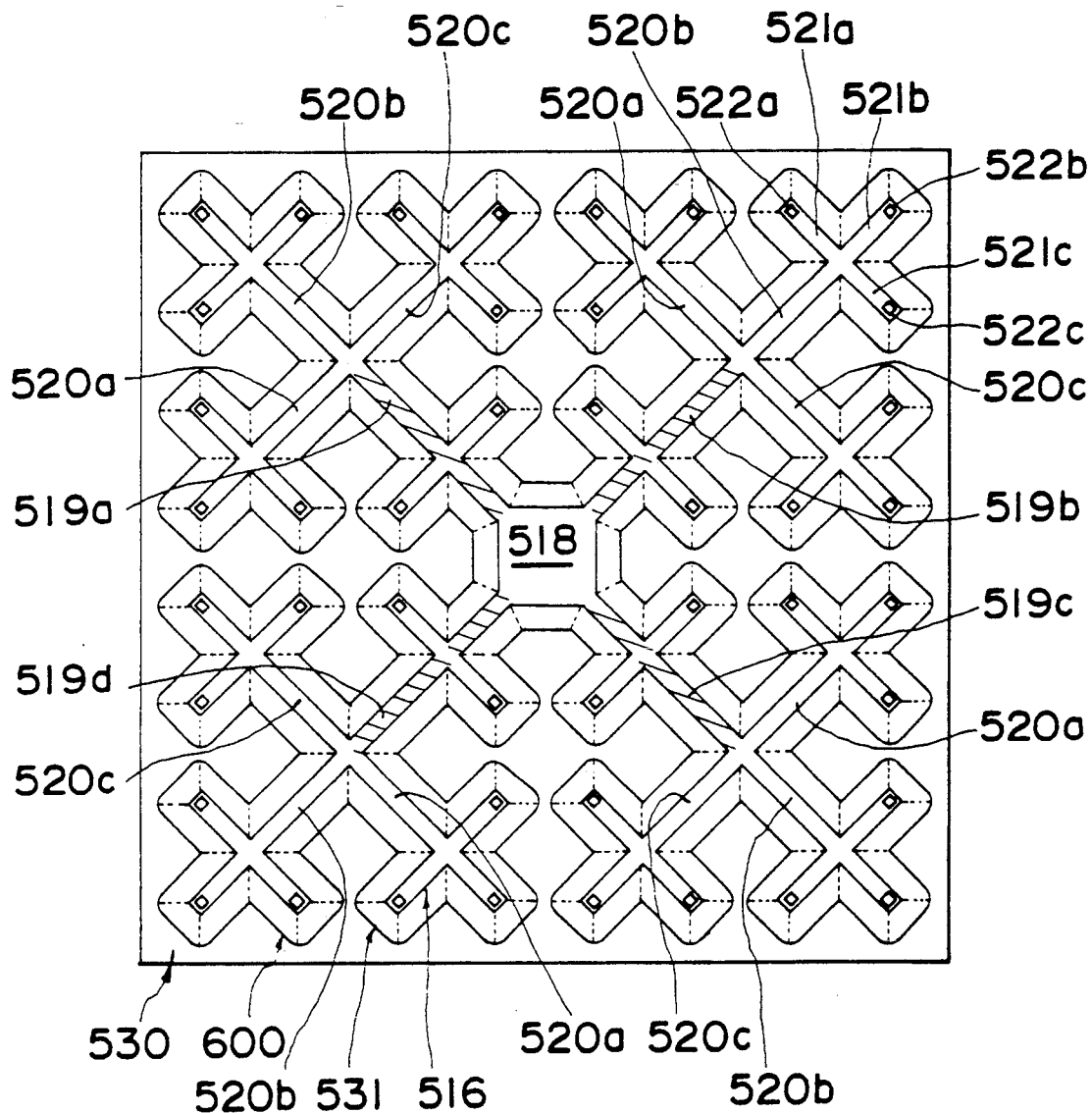
FIG. 16 is a view showing a surface of an AlGaInP series LED according to an eighth embodiment of the invention.
Figure 17A:
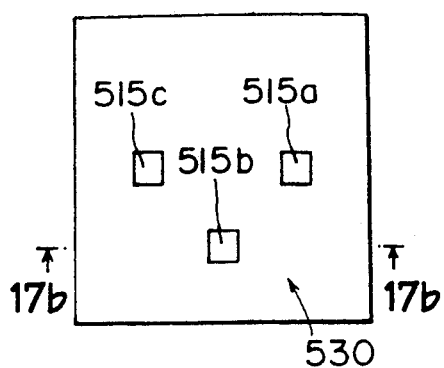
FIGS. 17(a), 17(b), 17(c), 17(d), 17(e), 17(f), 17(g), and 17(h) are views showing the process for fabricating the LED.
Figure 17B:
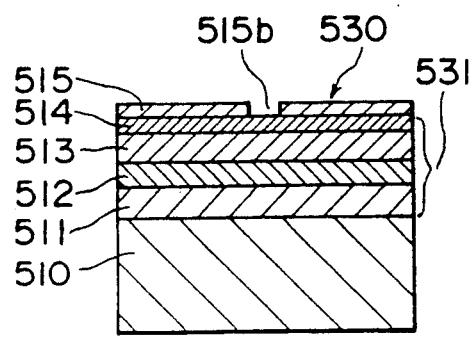
Figure 17C:
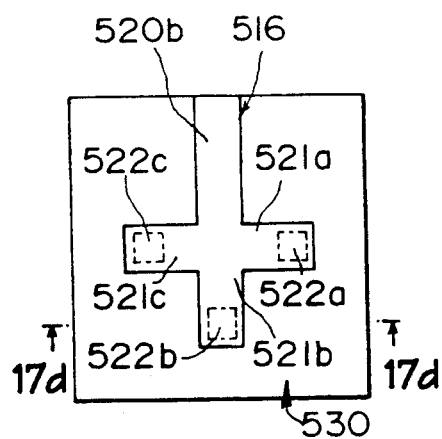
Figure 17D:
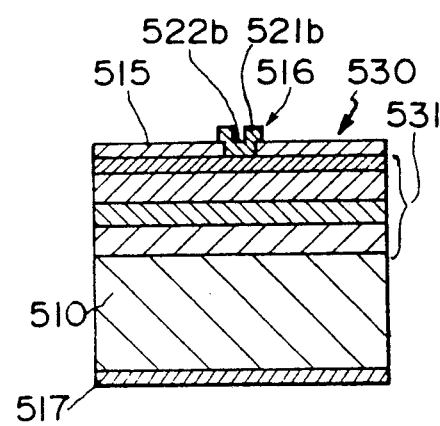
Figure 17E:
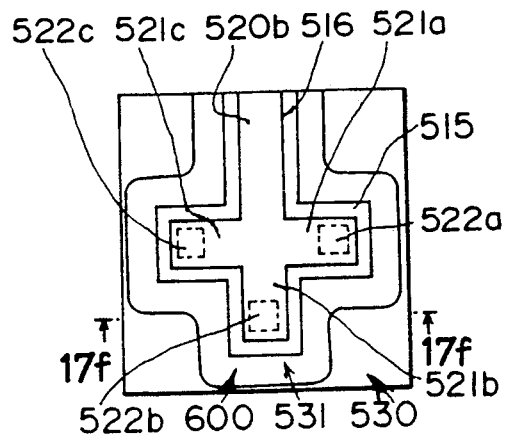
Figure 17F:
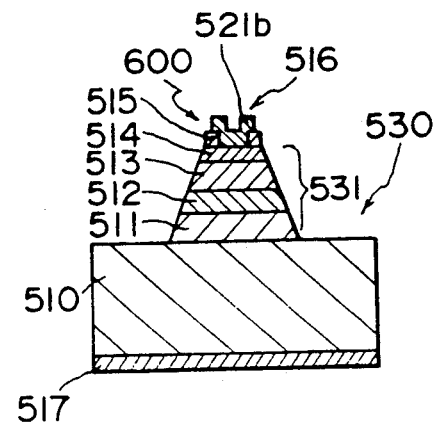
Figure 17G:
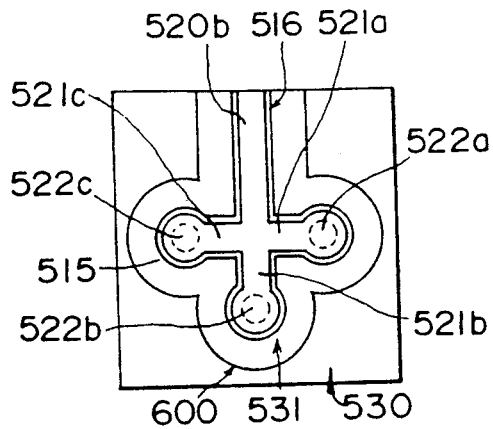
Figure 17H:
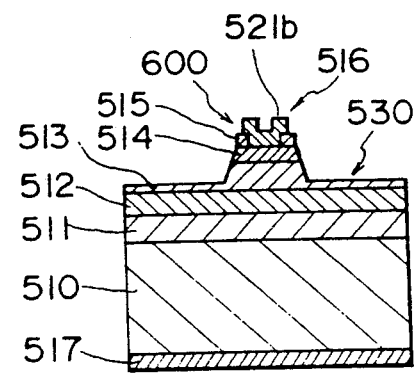

FIG. 16 illustrates the surface of an AlGaInP series LED according to an eighth embodiment of the invention. As shown in FIG. 16, the LED has, on its surface 530, a mesa portion 600 composed of a surface electrode 516 and a semiconductor layer 531 including a light-emitting layer. The pattern of the surface electrode 516 (approximately identical to the pattern of the mesa portion 600) has in its center an approximately rectangular pad 518 for wire bonding. From this pad 518, first-order branches 519a, 519b, 519c, and 519d are extending linearly in diagonal directions. The first-order branches 519a, 519b, 519c, and 519d are identical to one another in line width and length (range hatched in the figure). From the ends of the first-order branches 519a, 519b, 519c, and 519d, second-order branches 520a, 520b, and 520c are diverged and extending in three directions, respectively. The angle formed by the first-order and each of second-order branches is 0° or 90°. It is noted that, in actual design, there are unshown second-order branches which overlap the first-order branches 519a, 519b, 519c, and 519d. The second-order branches 520a, 520b, and 520c are identical to one another in line width and length, each being half the line length of the first-order branches. Also, from the ends of the second-order branches 520a, 520b, and 520c, third-order branches 521a, 521b, and 521c are diverged and extending linearly in three directions, respectively. The angle formed by the second-order and each of third-order branches is 0° or 90°. Also, the third-order branches 521a, 521b, and 521c are identical to one another in line width and length, each being half the line length of the second-order branches. It is noted that the reason why other third-order branches are extending from intermediate points of the first-order branches 519a, 519b, 519c, and 519d is that there are unshown ends of second-order branches which overlap the first-order branches 519a, 519b, 519c, and 519d. The semiconductor layer 531 is provided along the pattern of the surface electrode 516, protruding at the surface 530 in a mesa shape. At the ends of the third-order branches 521a, 521b, and 521c there are provided contact portions 522a, 522b, and 522c for making ohmic contact with the underlying semiconductor layer 531. Meanwhile, the rest of the surface electrode 516 other than the contact portions 522a, 522b, and 522c is in no direct contact with the semiconductor layer 531 (due to an $Al_2O_3$ insulating layer 515, later described).

As shown above, the surface electrode 516 has the same number of branches at any divergence, thus being of a self-similar configuration, namely fractal configuration, in which the relationship between adjoining lower- and higher-order branches is that 'X'-shaped four ends each have another half-in-length 'X' combined therewith in regular, analogous fashion. Accordingly, pattern designing can be easily made. Moreover, the approximately entire region of the semiconductor layer surface 530 can be covered in a tree-like form without causing higher-order branches to overlap with one another.

FIGS. 17 (a) to (f) illustrate the process for fabricating this LED. FIGS. 17 (a), (c), and (e) depict part of the surface 530 of the LED (specifically, the vicinity of the end of a second-order branch 520b) by way of example, and FIGS. 17 (b), (d), and (f) depict cross sections taken along the lines B—B, D—D, and F—F as indicated by arrow in FIGS. 17 (a), (c), and (e), respectively. This LED is fabricated in the following way.

(1) First, as shown in FIGS. 17 (a) and (b), on an n-type GaAs substrate 510 are deposited over all an n-type AlGaInP clad layer 511, an undoped AlGaInP light-emitting layer 512, a p-type AlGaInP clad layer 513, a p-type GaAs contact layer 514, successively, by the MOCVD (Metal Organic Chemical Vapor Deposition) method, and moreover formed an $Al_2O_3$ insulating layer 515. These layers 511, 512, 513 and 514 constitute a semiconductor layer 531. Then, by photolithography, openings 515a, 515b, and 515c are formed at specified points of the $Al_2O_3$ insulating layer 515.

(2) Next, as shown in FIGS. 17 (c) and (d), after a surface electrode (AuZn) 516 is deposited over all on the product of step (1), the surface electrode 516 is patterned into the fractal configuration as previously described. Here the points where the openings 515a, 515b, and 515c have been provided become contact portions 522a, 522b, and 522c. Further, a rear-face electrode 517 is also formed over all on the rear face of the substrate 510.

(3) Then, as shown in FIGS. 17 (e) and (f), by performing photolithography, the $Al_2O_3$ insulating layer 515 and the semiconductor layer 531 are etched and thereby processed into a mesa shape according to the pattern of the surface electrode 516 until the substrate surface 530 is reached. The etching may be either wet etching or RIBE (Reactive Ion-Beam Etching). By doing this, a mesa portion 600 is formed (the fabrication completed).

As stated above, this AlGaInP series LED presents its surface 530 covered with the mesa portion 600 in a tree-like form, with the surface electrode 516 and the semiconductor layer 531 in contact with each other only at the contact portions 522a, 522b, and 522c at the ends of the third-order (highest-order) branches 521a, 521b, and 521c. Accordingly, the junction portions underneath the ends of the third-order branches 521a, 521b, and 521c can be made light emission points, so that the light emission points and the light outgoing face (mesa slant face) can be made substantially closer to each other, as compared with the prior art. This in turn allows ineffective light emission to be reduced, which leads to improved external quantum efficiency. In actual characteristic measurement, the light emission wavelength was 570 nm (yellowish green) and the external quantum efficiency was 2.5%.

The mesa portion 600 is not limited to the one having the above-described shape, but may be any other in which light is allowed to go out through the mesa slant face substantially. For example, as shown in FIG. 17 (h), it may be arranged that the etching ranges up to an intermediate point of the p-type AlGaInP clad layer 513, ending short of the undoped AlGaInP light-emitting layer 512. Further, although not shown, the arrangement may be such that the etching ranges up to an intermediate point of the undoped AlGaInP light-emitting layer 512, ending short of the n-type AlGaInP clad layer 511. In contrast to this, such arrangements are not included that the etching ranges only up to the p-type GaAs contact layer 514. The p-type GaAs contact layer 514 is merely a layer only intended for improving the electrical characteristic, and therefore does not allow the light go out of its slant face. Similarly, the layers opaque with respect to light are also excluded from the mesa portion.

Also, as shown in FIG. 17 (g), the end of the mesa portion 600 (surface electrode 516 and semiconductor layer 531) may be shaped into a sector by changing the pattern of the photolithography. This sector-shaped mesa portion gives an even enhanced light emission efficiency.

The pad 518 may also be positioned at a peripheral part, without being limited to the center, of the LED surface 530.

The contact portions 522a, 522b, and 522c may be further provided, for example, at intermediate points of the second-order branches 520a, 520b, and 520c as shown in FIG. 16 as well, not only at the ends of the third-order (highest-order) branches 521a, 521b, and 521c. In this case, although the current light conversion efficiency slightly lowers, yet the total amount of light emission per the LED can be increased.

The pattern shape of the surface electrode 516 may also be formed by the so-called mask deposition (deposition using a metal mask having openings identical in shape to the surface electrode 516), not by etching.

The surface electrode 516 and the rear-face electrode 17 may be provided not before but after mesa-etching the semiconductor layer 531.

The material of the LED is not limited to AlGaInP, but may be a III - V group compound semiconductor such as AlGaAs, GaAsP, GaP, AlGaN, and GaInAsP, a II - VI group compound semiconductor such as ZnCdSSe and ZnCdSeTe, or a chalcopyrite series semiconductor such as CuAlSSe and CuGaSSe.

The material of the substrate is not limited to GaAs, but may be GaP, InP, sapphire, or the like, either transparent or opaque with respect to light emission wavelength. The conductive type of the substrate may be either n-type or p-type.

Although the surface electrode 516 having branches only on the LED surface 530 side has been provided in this embodiment, branches are further provided also to the surface electrode 517 on the rear face of the substrate when a substrate transparent with respect to light emission wavelength is used. This arrangement allows the light outgoing efficiency to be further enhanced.

The junction of the interface of the light-emitting layer 512 is not limited to the double-hetero junction, but may be a single-hetero junction or a homo junction.

Although the semiconductor layers 511, . . . , 514 have been formed by the MOCVD (Metal Organic Chemical Vapor Deposition) method, yet they may be also by the MBE (Molecular Beam Epitaxy), VPE (Vapor Phase Epitaxy), LPE (Liquid Phase Epitaxy), or other like methods. The pn-junction may be formed either during the crystal growth or by diffusing the dopant after crystal growth.

Furthermore, as the material of the surface electrode (p-side electrode) 516 are available AuZn, InAu, Cr/Au, Mo/Au, Ti/Pt/Au, Au, Al, In, ITO (indium tin oxide), $InO_2$, $SnO_2$, and their stacked films. As the material of the rear-face electrode (n-side electrode) 517, on the other hand, are available AuGe/Ni, AuSn, AuSi, Mo/Au, Au, Al, In, ITO and their stacked films.

Ninth Embodiment

Figure 18A:
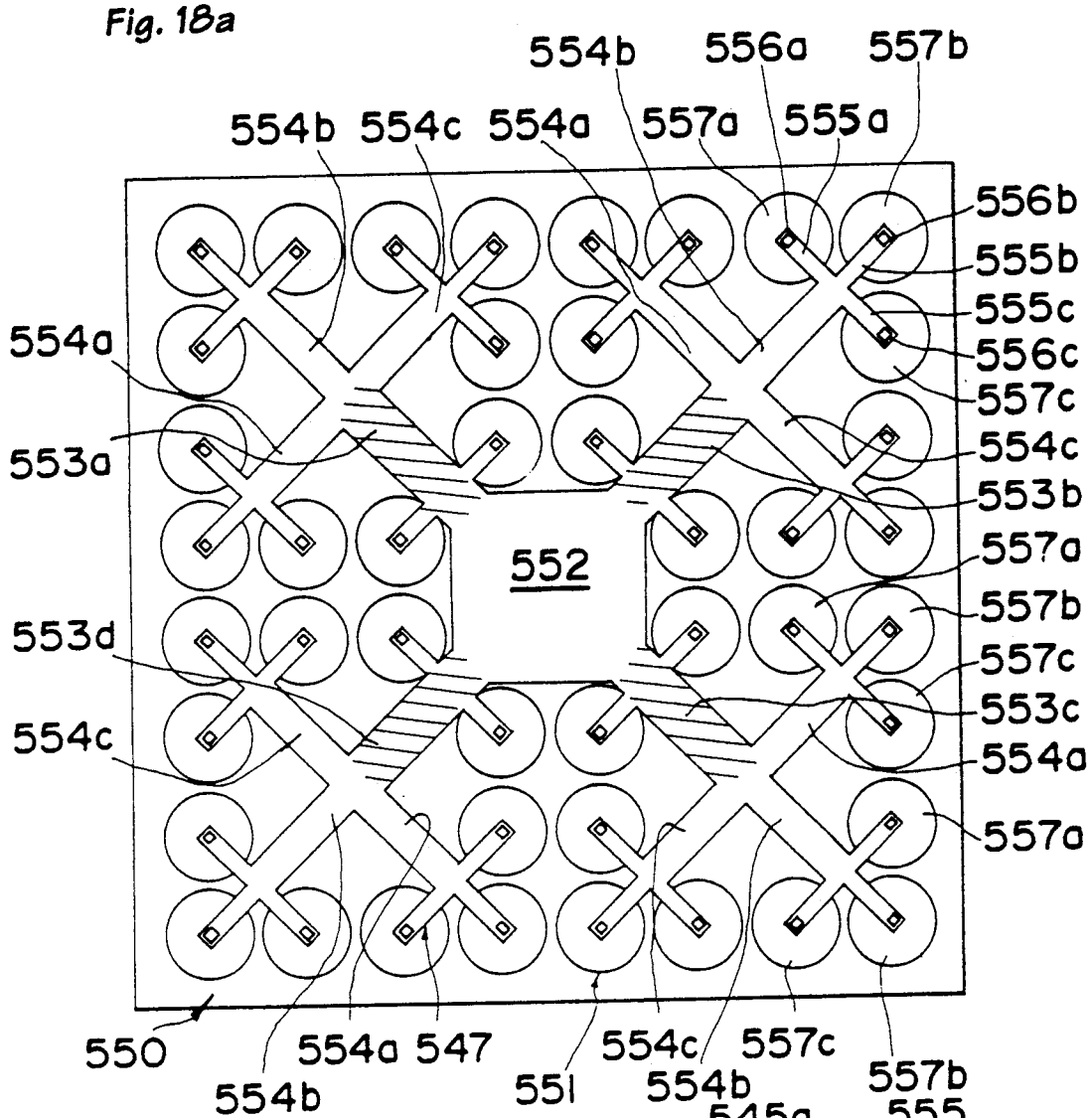
FIGS. 18(a), 18 (b), and 18(c) are views showing the surface and a cross section of a ZnCdSe series LED according to a ninth embodiment of the invention.
Figures 18B, 18C:
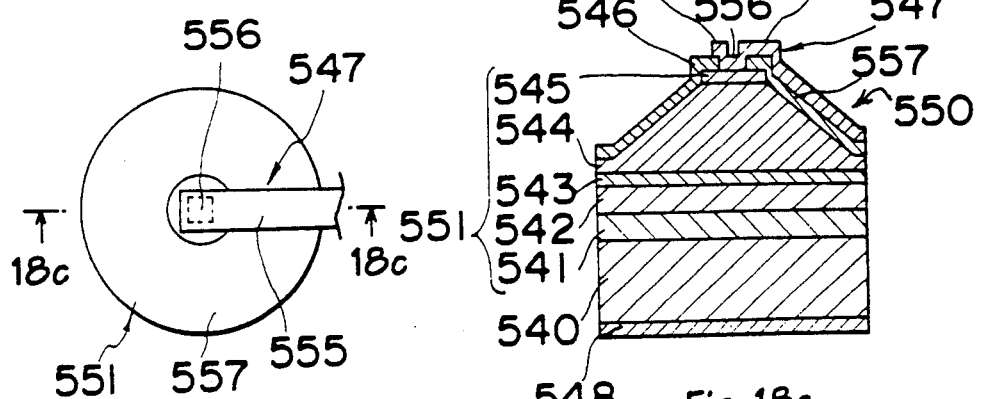
Figure 20C:
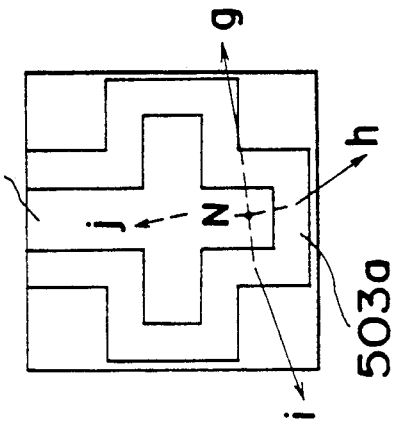
FIGS. 20(a), 20(b) 20(c), 20(d), 20(e), and 20(f) are views for explaining the function of the invention.
Figure 20B:
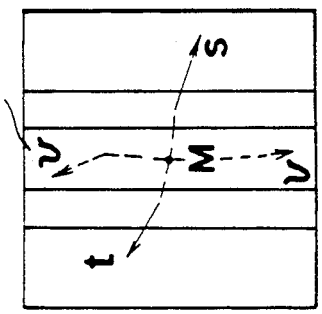
Figure 20A:
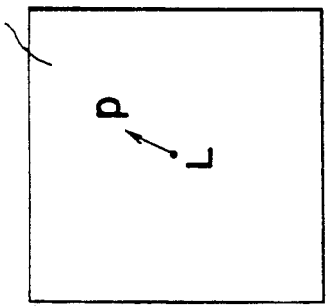
Figure 20F:
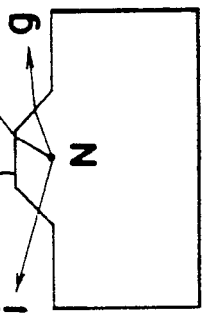
Figure 20E:
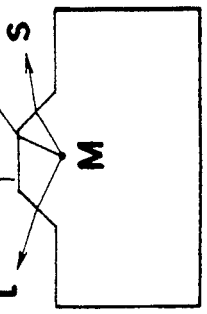
Figure 20D:
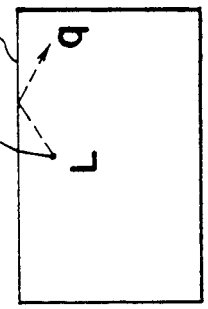

FIG. 18 illustrates a ZnCdSe series LED according to a ninth embodiment of the invention. FIG. 18 (a) shows the whole surface of the LED, and FIG. 18 (b) shows its part (the vicinity of one mesa portion) by way of example. FIG. 18 (c) is a sectional view taken along the line C—C in FIG. 18 (b).

As shown in FIG. 18 (a), this LED has, on its surface 550, a surface electrode 547, and a plurality of mesa portions 557a, 557b, 557c, . . . formed from a semiconductor layer 551 including a light-emitting layer. The pattern of the surface electrode 547 has in its center an approximately rectangular pad 552 for wire bonding, as in the eighth embodiment. From this pad 552, first-order branches 553a, 553b, 553c, and 553d are extending linearly in diagonal directions. The first-order branches 553a, 553b, 553c, and 553d are identical to one another in line width and length (range hatched in the figure). From the ends of the first-order branches 553a, 553b, 553c, and 553d, second-order branches 554a, 554b, and 554c are diverged and extending in three directions, respectively. The angle formed by the first-order and each of second-order branches is 0° or 90°. It is noted that, in actual design, there are unshown second-order branches which overlap the first-order branches 553a, 553b, 553c, and 553d. The second-order branches 554a, 554b, and 554c are identical to one another in line width and length. Also, from the ends of the second-order branches 554a, 554b, and 554c, third-order branches 555a, 555b, and 555c are diverged and extending linearly in three directions, respectively. The angle formed by the second-order and each of third-order branches is 0° or 90°. Also, the third-order branches 555a, 555b, and 555c are identical to one another in line width and length. It is noted that the reason why other third-order branches are extending from intermediate points of the first-order branches 553a, 553b, 553c, and 553d is that there are unshown ends of second-order branches which overlap the first-order branches 553a, 553b, 553c, and 553d. As the number of order increases, the length of the various-order branches gradually decreases and the line width of the various-order branches gradually decreasing. The semiconductor layer 551 is provided for each end of the third-order (highest-order) branches 555a, 555b, and 555c of the surface electrode 547 at the LED surface 550 in a mesa shape. At the ends of the third-order branches 555a, 555b, and 555c there are provided contact portions 556a, 556b, and 556c for making ohmic contact with the underlying semiconductor layer 551. Meanwhile, the rest of the surface electrode 547 other than the contact portions 555a, 555b, and 555c is in no direct contact with the semiconductor layer 551 (due to an $Al_2O_3$ insulating layer 546, later described).

This LED is fabricated in the following way.

(1) First, as shown in FIG. 18 (c), on an n-type GaAs substrate 540 are deposited over all an n-type InGaAs buffer layer 541, an n-type ZnSe clad layer 542, an undoped $Zn_{1-x}Cd_xSe$ (x=0.2) strained quantum well light-emitting layer 543, a p-type ZnSe clad layer 544, and a p-type GaAs contact layer 545, successively, by the MBE method. These layers 541, 542, 543 and 545 are included in a semiconductor layer 551.

(2) Then, by performing photolithography, the p-type ZnSe clad layer 544 is etched into a truncated cone shape to form a mesa portion 557.

(3) After removing the photoresist, an $Al_2O_3$ insulating layer 546 is formed on the resulting product. Then, by photolithography, an opening 545a is formed at a point of the $Al_2O_3$ insulating layer 546 which corresponds to the top face of the mesa portion 557.

(4) Next, after depositing the surface electrode 547 over all on the product of step (3), the surface electrode 547 is patterned into a fractal configuration as previously described. Here the point where the opening 545a has been provided becomes a contact portion 556. Moreover, a rear-face electrode 548 is also formed on the rear face of the substrate 540 (the fabrication completed).

As stated above, since this LED has semiconductor layer 551 including the light-emitting layer 543 provided for each end of the third-order (highest-order) branches 555 of the surface electrode 547, not only light emitted by the light-emitting layer 543 toward directions in which no third-order branches 555 exist but also light emitted toward the direction in which the third-order branches 555 exist (right side in FIG. 18 (b) and (c)) can be allowed to go out of the LED effectively in its most portion. In other words, since the mesa slant face surrounds the light emission point, the light emission point and the mesa slant face can be made closer substantially as compared to the eighth embodiment. Accordingly, the light emitted by the light-emitting layer 543 can be allowed to go out of the LED efficiently through the annular mesa slant face, which leads to further improved external quantum efficiency, as compared with the LED of the eighth embodiment.

The material of the substrate is not limited to GaAs, but may be ZnSe or the like, either transparent or opaque with respect to light emission wavelength. The conductive type of the substrate may be either n-type or p-type.

The material of the LED is not limited to ZnCdSe, but may be a III - V group compound semiconductor such as AlGaInP, AlGaAs, GaAsP, GaP, AlGaN, and GaInAsP, a II - VI group compound semiconductor such as ZnSe, ZnCdSSe, and ZnCdSeTe, or a chalcopyrite series semiconductor such as CuAlSSe and CuGaSSe.

Although the light-emitting layer 543 has been formed from $Zn_{1-x}Cd_xSe$ (x=0.2) in this embodiment, the value of x is not particularly limited to this. It may be, for example, ZnSe of x=0. Also, the light-emitting layer may be of ZnSe/ZnCdSe multiple-quantum-well structure.

Although the buffer layer 541 has been formed from n-type InGaAs in this embodiment, it may also be from an n-type ZnSSe or n-type ZnS/ZnSe strained layered superlattice layer.

Further, although the semiconductor layers 541, ..., 545 have been formed by the MBE method in this embodiment, yet the method may also be MOCVD, VPE, LPE, or other like methods. The pn-junction may be formed either during the crystal growth or by diffusing the dopant after crystal growth.

Tenth Embodiment

FIG. 19 illustrates an AlGaInP series LED according to a tenth embodiment of the invention. FIG. 19 (a) shows the whole surface of the LED, and FIG. 19 (b) shows its part (the vicinity of one mesa portion) by way of example. FIG. 19 (c) is a sectional view taken along the line C—C in FIG. 19 (b).

As shown in FIG. 19 (a), this LED presents, on its layer surface 590, a surface electrode 576, and a plurality of mesa portions 586a, 586b, 586c, ... formed from a semiconductor layer 591 including a light-emitting layer. The surface electrode 576 has an approximately rectangular pad 581, first-order branches 582a and 582b, second-order branches 583a, 583b, 583c, 583d, 583e, 583f, 583g, and 583h, third-order branches 584a, 584b, 584c, 584d, 584e, 584f, 584g, and 584h diverged from the second-order branches 583a, ..., 583h, respectively. More specifically, the first-order branches 582a and 582b are provided on a line parallel to the side face of the LED passing through the pad 581, and eight second-order branches 583a, ..., 583h are provided perpendicularly to the first-order branches 582a and 582b. Further, eight third-order branches 584a, ..., 584h are provided perpendicularly to the second-order branches 583a, ..., 583h. It is noted that the third-order branches are actually not formed at portions where they overlap the pad 581. The semiconductor layer 591 (i.e. mesa portions 586a, ...) is shaped such that it protrudes in a cylindrical form for each end of the third-order (highest-order) branches 584a, ... 584h of the surface electrode 576. At the ends of the third-order branches 584a, 584b, 584c, ..., there are provided contact portions 585a, 585b, 585c, ... for making contact with the underlying semiconductor layer 591.

This LED is fabricated in the following way.

(1) First, as shown in FIG. 19 (c), the surface of an n-type GaAs substrate 570 is selectively etched so as to form a cylindrical protrusion 570a at portions to form a mesa portion 586.

(2) Next, by the MOCVD method, on the product of step (1) are deposited an n-type AlGaInP clad layer 571, an undoped AlGaInP light-emitting layer 572, a p-type AlGaInP clad layer 573, a p-type GaAs contact layer 574, an n-type GaAs current blocking layer 575, successively, over all. These layers 571, 572, 573 and 575 are included in a semiconductor layer 591. By doing this, protruding mesa portions 586 are formed at portions of the protrusion 570a. As a result, the mesa side face 579 has smaller thicknesses of the layers 571, 572, and 573 than the other portions (flat portions).

(3) Next, by performing photolithography, the n-type GaAs current blocking layer 575 is selectively etched so as to form an opening 585 at the portion on the protrusion 570a, making the p-type GaAs contact layer 574 exposed within the opening 585.

(4) Then the surface electrode 576 is deposited on the product of step (3) over all. By performing photolithography, the surface electrode 576, the n-type GaAs current blocking layer 575, and the p-type GaAs contact layer 574 are processed into the pattern as depicted in the figure. Finally, a rear-face electrode 577 is formed on the rear face of the substrate 570 (the fabrication completed).

When the fabrication is carried out by the above-described steps, the mesa side face 579 has smaller thicknesses of the layers 571, 572, and 573, and therefore these portions have greater electrical resistance than the flat portions. As a result, only the portions overlying the protrusions 570a out of the light-emitting layer 572 will emit light. Accordingly, as in the ninth embodiment, the light emission point and the light outgoing face (mesa slant face) 579 can be made closer substantially, thus allowing the light emitted by the light-emitting layer 572a to go out of the LED at high efficiency.

When the semiconductor layer 591 is provided after forming the protrusion 570a as in the present tenth embodiment, the depth of etching, i.e. the height of the mesa portions can be controlled more easily, as compared to when the protrusions (mesa portions) are formed after forming the semiconductor layers 531 and 551 as in the eighth and ninth embodiments. This is due to the fact that the composition to be objected for etching is of one kind.

It is noted that the deposition can be almost fully prevented from taking place onto the side face of the protrusion 570a by optimizing the MOCVD conditions in depositing the semiconductor layer 591. For example, it can be implemented by controlling the substrate temperature and material gas mixing ratio, in addition to setting the surface orientation of the GaAs substrate 570 to (001) and that of the side face to {111}.

As apparent from the above description, the light-emitting diodes of the eighth to tenth embodiments have a semiconductor layer which includes a light-emitting layer, and a surface electrode successively stacked on respective substrates, light emitted by the light-emitting layer being allowed to go out of the LED through the portions that are not covered with the surface electrode out of the semiconductor layer, wherein the surface electrode has at least a pad, first-order branches linearly extending from the pad, second-order branches diverged and linearly extending from the first-order branches, and third-order branches diverged and linearly extending from the second-order branches, the semiconductor layer being provided along the pattern of the surface electrode in a mesa shape in which the semiconductor layer protrudes at the LED surface. Thus, the light emission point and the light outgoing face can be made closer substantially as compared with the prior art. Accordingly, light emitted by the light-emitting layer can be allowed to go out of the LED efficiently, which leads to improved external quantum efficiency.

Also, the light-emitting diode of the present embodiments have, a semiconductor layer including a light-emitting layer, and a surface electrode successively stacked on respective substrates, light emitted by the light-emitting layer being allowed to go out of the LED through portions of the semiconductor layer that are not covered with the surface electrode, wherein the surface electrode has at least a pad, first-order branches linearly extending from the pad, second-order branches diverged and linearly extending from the first-order branches, and third-order branches diverged and linearly extending from the second-order branches, the semiconductor layer being provided for each end of the highest-order branches of the surface electrode in a mesa shape in which the semiconductor layer protrudes at the LED surface. Thus, the vicinity of the light emission point can be surrounded by light outgoing faces (mesa slant faces), so that the light emission point and the light outgoing face can be made closer substantially as compared with the prior art. Accordingly, the light emitted by the light-emitting layer can be allowed to go out of the LED efficiently, which leads to improved external quantum efficiency.

Also, when the ends of the highest-order branches of the surface electrode and the semiconductor layer are in electrical contact with each other while the rest of the surface electrode and the semiconductor layer are not in electrical contact with each other, the portions of the surface electrode underneath the ends out of the semiconductor layer can be made light emission points. Accordingly, light emitted by the light-emitting layer can be easily made to reach the light outgoing faces (mesa slant faces), thus allowing the external quantum efficiency to be further improved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A light-emitting diode comprising a semiconductor region, the semiconductor region including a light-emitting layer, stacked on a surface of a semiconductor substrate and a surface electrode stacked on the semiconductor region, and which further has a rear-face electrode on a rear face of the substrate, light emitted from the light-emitting layer being made to go out through a portion of the semiconductor layer that is not covered with the surface electrode, the surface electrode comprising at least:

a pad;
 first-order branches linearly extending from the pad;
 a plurality of second-order branches diverged and linearly extending from each of the first-order branches; and
 a plurality of mth-order branches diverged and linearly extending from each (m−1)th-order branch, wherein m is a natural number greater than 2, each mth-order branch having a tip;
 wherein no branch intersects any branch of lower or equal order except the branch from which it diverges and wherein the tips of the highest order branches do not intersect any other branch, the highest order being a natural number greater than 2.

2. A light-emitting diode as claimed in claim 1, wherein a line width of the branches of each order decreases as the number of order increases.

3. A light-emitting diode as claimed in claim 2, wherein a length of the branches of each order decreases at a constant rate as the number of order increases.

4. A light-emitting diode as claimed in claim 1, wherein a length of the branches of each order decreases at a constant rate as the number of order increases.

5. A light-emitting diode as claimed in claim 1, wherein an angle formed by adjoining lower- and higher-order branches is 0° or 90°.

6. A light-emitting diode as claimed in claim 1, wherein ends of the highest-order branches of the surface electrode and the semiconductor region are in electrical contact with each other while the pad of the surface electrode and the semiconductor region are electrically isolated from each other.

7. A light-emitting diode as claimed in claim 6, wherein the semiconductor region has, on a surface electrode side, a contact layer made of a material that makes ohmic contact with the surface electrode and having a conductive type of either p-type or n-type, and moreover has, between the contact layer and portions of the surface electrode other than the ends of the highest-order branches of the surface electrode, a current blocking layer having a conductive type different from that of the contact layer.

8. A light-emitting diode as claimed in claim 6, wherein a line width of the branches of each order decreases as the number of order increases.

9. A light-emitting diode as claimed in claim 1, wherein at least part of the semiconductor region is provided along a pattern of the surface electrode in a protruding mesa shape.

10. A light-emitting diode as claimed in claim 9, wherein the ends of the highest-order branches of the surface electrode and the semiconductor region are in electrical contact with each other while the rest of the surface electrode and the semiconductor region are electrically isolated from each there.

11. A light-emitting diode as claimed in claim 1, further comprising protrusions formed by at least part of the semiconductor region and provided under each end of the highest-order branches of the surface electrode.

12. A light-emitting diode as claimed in claim 11, wherein the ends of the highest-order branches of the surface electrode and the semiconductor region are in electrical contact with each other while the rest of the surface electrode and the semiconductor region are electrically isolated from each there.

13. A light-emitting diode as claimed in claim 1 wherein the number of higher-order branches extending from the tip of each branch is equal for each order of branches.

14. A light-emitting diode comprising a semiconductor region, the semiconductor region including a light-emitting layer, stacked on a surface of a semiconductor substrate and a surface electrode stacked on the semiconductor region, and which further has a rear-face electrode on a rear face of a substrate, light emitted from the light-emitting layer being made to go out through a portion of the semiconductor layer that is not covered with the surface electrode, the surface electrode comprising at least:

a pad;

first-order branches linearly extending from the pad;

second-order branches diverged and linearly extending from the first-order branches; and third-order branches diverged and linearly extending from the second-order branches;

wherein ends of the highest-order branches of the surface electrode and the semiconductor region are in electrical contact with each other while the pad of the surface electrode and the semiconductor region are electrically isolated from each other; and wherein the semiconductor region has, on a surface electrode side, a contact layer made of a material that makes ohmic contact with the surface electrode, and an insulating layer is provided between portions of the surface electrode other than the ends of the highest-order branches of the surface electrode, and the semiconductor region.

15. A light-emitting diode comprising a semiconductor region, the semiconductor region including a light-emitting layer, stacked on a surface of a semiconductor substrate and a surface electrode stacked on the semiconductor region, and which further has a rear-face electrode on a rear face of a substrate, light emitted from the light-emitting layer being made to go out through a portion of the semiconductor layer that is not covered with the surface electrode, the surface electrode comprising at least:

a pad;

first-order branches linearly extending from the pad;

second-order branches diverged and linearly extending from the first-order branches; and third-order branches diverged and linearly extending from the second-order branches;

wherein ends of the highest-order branches of the surface electrode and the semiconductor region are in electrical contact with each other while the pad of the surface electrode and the semiconductor region are electrically isolated from each other; and wherein the semiconductor region has, on a surface electrode side, a layer made of a material that yields a Schottky barrier with respect to the surface electrode, and moreover has, between the layer and the ends of the highest-order branches of the surface electrode, a contact layer made of a material that makes ohmic contact with the surface electrode.

16. A light-emitting diode comprising a semiconductor region, the semiconductor region including a light-emitting layer, stacked on a surface of a semiconductor substrate and a surface electrode stacked on the semiconductor region, and which further has a rear-face electrode on a rear face of a substrate, light emitted from the light-emitting layer being made to go out through a portion of the semiconductor layer that is not covered with the surface electrode, the surface electrode comprising at least:

a pad;

first-order branches linearly extending from the pad;

second-order branches diverged and linearly extending from the first-order branches; and third-order branches diverged and linearly extending from the second-order branches;

wherein ends of the highest-order branches of the surface electrode and the semiconductor region are in electrical contact with each other while the pad of the surface electrode and the semiconductor region are electrically isolated from each other; and wherein the surface electrode comprises an upper electrode provided on the entire region occupied by the surface electrode and made of a material that does not make ohmic contact with a surface of the semiconductor region, and a lower electrode provided between the upper electrode d and the surface of the semiconductor region at the ends of the highest-order branches and made of a material that makes ohmic contact with the semiconductor region surface.

* * * * *